(12) United States Patent
Gadh et al.

(10) Patent No.: US 11,387,654 B2
(45) Date of Patent: Jul. 12, 2022

(54) BATTERY ENERGY STORAGE CONTROL SYSTEMS AND METHODS FOR A GRID TIE INVERTER COUPLED TO A PHOTOVOLTAIC SYSTEM

(71) Applicant: THE REGENTS OF THE UNIVERSITY OF CALIFORNIA, Oakland, CA (US)

(72) Inventors: Rajit Gadh, Los Angeles, CA (US); Hamidreza Nazaripouya, Sherman Oaks, CA (US); Chi-Cheng Chu, Aliso Viejo, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 639 days.

(21) Appl. No.: 16/193,048

(22) Filed: Nov. 16, 2018

(65) Prior Publication Data
US 2019/0157869 A1 May 23, 2019

Related U.S. Application Data

(63) Continuation of application No. PCT/US2017/033030, filed on May 17, 2017.
(Continued)

(51) Int. Cl.
*H02J 3/32* (2006.01)
*H02J 7/35* (2006.01)
(Continued)

(52) U.S. Cl.
CPC ............... *H02J 3/32* (2013.01); *B60L 53/62* (2019.02); *B60L 53/66* (2019.02); *B60L 53/68* (2019.02);
(Continued)

(58) Field of Classification Search
CPC .... H02J 3/32; H02J 3/381; H02J 3/383; H02J 3/003; H02J 7/02; H02J 7/007; H02J 7/00;
(Continued)

(56) References Cited

U.S. PATENT DOCUMENTS 6,118,678 A * 9/2000 Limpaecher ........ H02M 5/4505
363/60
11,204,591 B2 * 12/2021 Devi ...................... G01W 1/10
(Continued)

FOREIGN PATENT DOCUMENTS

CN          102751734 A       10/2012
CN          108038580 A  *    5/2018
(Continued)

OTHER PUBLICATIONS

Massaoudi, Mohamed, et al. "A novel approach based deep RNN using hybrid NARX-LSTM model for solar power forecasting." arXiv preprint arXiv:1910.10064 (2019). (Year: 2019).*
(Continued)

*Primary Examiner* — Richard Isla
*Assistant Examiner* — Manuel Hernandez
(74) *Attorney, Agent, or Firm* — O'Banion & Ritchey LLP; John P. O'Banion

(57) ABSTRACT

A distributed control system uses a central controller in Internet communication with a local controller to manage grid tie attachment with a battery to form an integrated battery energy storage system (BESS). The BESS is capable of charging or discharging the battery, as well as correcting grid phase with volt amp reactive (VAR) leading or lagging operation modes. Examples shown include simple BESS charging and discharging, BESS integrated with renewable energy sources (here photovoltaic), and direct current fast charge (DCFC) connections with an electric vehicle.

6 Claims, 15 Drawing Sheets

Related U.S. Application Data

(60) Provisional application No. 62/337,949, filed on May 18, 2016.

(51) Int. Cl.

| | |
|---|---|
| G01R 31/367 | (2019.01) |
| H02J 3/38 | (2006.01) |
| H02J 7/00 | (2006.01) |
| B60L 53/68 | (2019.01) |
| B60L 53/62 | (2019.01) |
| B60L 53/66 | (2019.01) |
| B60L 58/15 | (2019.01) |
| H02J 7/02 | (2016.01) |
| H01M 10/42 | (2006.01) |
| H01M 10/48 | (2006.01) |
| H02J 3/00 | (2006.01) |

(52) U.S. Cl.
CPC ........... *B60L 58/15* (2019.02); *H01M 10/425* (2013.01); *H01M 10/482* (2013.01); *H02J 3/381* (2013.01); *H02J 3/383* (2013.01); *H02J 7/00* (2013.01); *H02J 7/007* (2013.01); *H02J 7/0014* (2013.01); *H02J 7/02* (2013.01); *H02J 7/35* (2013.01); *B60L 2240/70* (2013.01); *G01R 31/367* (2019.01); *H01M 2010/4271* (2013.01); *H02J 3/003* (2020.01); *H02J 7/0029* (2013.01)

(58) Field of Classification Search
CPC .......... H02J 7/0014; H02J 7/35; H02J 7/0029; B60L 53/68; B60L 53/62; B60L 53/66; B60L 58/15; B60L 2240/70; H01M 10/425; H01M 10/482; H01M 2010/4271; G01R 31/367
USPC ................................................. 320/134, 101
See application file for complete search history.

(56) References Cited

U.S. PATENT DOCUMENTS

| | | | | |
|---|---|---|---|---|
| 2013/0106360 | A1 | 5/2013 | Gaylo | |
| 2013/0113413 | A1* | 5/2013 | Harty | H01M 10/46 320/101 |
| 2014/0015469 | A1* | 1/2014 | Beaston | H02J 7/35 320/101 |
| 2016/0111900 | A1 | 4/2016 | Beaston | |
| 2019/0340545 | A1* | 11/2019 | Minegishi | G01W 1/10 |
| 2020/0106385 | A1* | 4/2020 | Wenzel | H02J 3/32 |
| 2020/0334577 | A1* | 10/2020 | Anderson | G06Q 50/02 |

FOREIGN PATENT DOCUMENTS

| | | | |
|---|---|---|---|
| CN | 112149905 A | * | 12/2020 |
| WO | 2017201125 | | 11/2017 |

OTHER PUBLICATIONS

V. Prema, M. S. Bhaskar, D. Almakhles, N. Gowtham and K. U. Rao, "Critical Review of Data, Models and Performance Metrics for Wind and Solar Power Forecast," in IEEE Access, vol. 10, pp. 667-688, 2022, doi: 10.1109/ACCESS.2021.3137419. (Year: 2021).*

Huang, Xiaoqiao, et al. "Forecasting hourly solar irradiance using hybrid wavelet transformation and Elman model in smart grid." IEEE Access 7 (2019): 139909-139923. (Year: 2019).*

Wang, Jujie. "A hybrid wavelet transform based short-term wind speed forecasting approach." The Scientific World Journal 2014 (2014). (Year: 2014).*

Oppenheim, Alan V et al., "Discrete-Time Signal Processing", Second Edition, 1999, Prentice-Hall, ISBN 0-13-754920-2, in particular Chapters 5 and 7.

Blondel, Vincent D et al., "Explicit Solutions for Root Optimization of a Polynomial Family", Proceedings of the 49th IEEE Conference on Decision and Control (CDC), 2010, pp. 485-488.

Nazaripouya, H et al., "Univariate Time Series Prediction of Solar Power Using a Hybrid Wavelet-ARMA-NARX Prediction Method" submitted to T&D 2016 IEEE conference. 978-1-5090-2157-4/16/ $31.00 © 2016 IEEE.

Boyd, S. et al., "Convex Optimization", Cambridge, U.K.: Cambridge Univ. Press, 2004, pp. 1-730.

Li, Xiangjun et al., "Battery Energy Storage Station (BESS)-Based Smoothing Control of Photovoltaic (PV) and Wind Power Generation Fluctuations," Sustainable Energy, IEEE Transactions on, vol. 4, No. 2, pp. 464-473, Apr. 2013, published Mar. 7, 2013.

Teleke S et al., "Control strategies for battery energy storage for wind farm dispatching", IEEE Trans. Energy Convers., vol. 24, No. 3, pp. 725-732, Sep. 2009, first published Jun. 10, 2009, current version published Aug. 21, 2009.

Orbergsson, Egill et al., "Primary Frequency Regulation with Li-Ion Battery Based Energy Storage System—Evaluation and Comparison of Different Control Strategies," Telecommunications Energy Conference 'Smart Power and Efficiency' (INTELEC), Proceedings of 2013 35th International, vol. no., pp. 1-6, Oct. 13-17, 2013.

Nazaripouya, H. et al., "Optimal Sizing and Placement of Battery Energy Storage in Distribution System Based on Solar Size for Voltage Regulation", 2015 IEEE PES General Meeting, Denver, Colorado, Jul. 26-30, 2015.

Lamichhane, S. et al., "Micro Grid Stability Improvements by Employing Storage," in Green Technologies Conference, 2013 IEEE , Conference Paper, pp. 250-258, Apr. 4-5, 2013.

Abu Abdullah, M. et al., "An Effective Power Dispatch Control Strategy to Improve Generation Schedulability and Supply Reliability of a Wind Farm Using a Battery Energy Storage System," Sustainable Energy, IEEE Transactions on, vol. 6, No. 3, pp. 1093-1102, Jul. 2015, first published Sep. 30, 2014.

Mehr, T.H. et al., "Grid-connected Lithium-ion battery energy storage system for load leveling and peak shaving", Power Engineering Conference (AUPEC), 2013 Australasian Universities, pp. 1-6, Sep. 29-Oct. 3, 2013.

Wang, Yubo et al., "Vehicle-to-Grid Automatic Load Sharing with Driver Preference in Micro-Grids", ISGT Europe 14, Istanbul, Turkey, Oct. 12-15, 2014.

Wang, Bin et al., "EV charging algorithm implementation with user price preference", in Innovative Smart Grid Technologies Conference (ISGT), 2015 IEEE Power & Energy Society, pp. 1-5, Feb. 18-20, 2015.

Majidpour, M. et al., "Modified pattern sequence-based forecasting for electric vehicle charging stations", in Smart Grid Communications (SmartGridComm), 2014 IEEE International Conference on, pp. 710-715, Nov. 3-6, 2014.

Chynoweth, J. et al., "Smart electric vehicle charging infrastructure overview", in Innovative Smart Grid Technologies Conference (ISGT), 2014 IEEE PES, pp. 1-5, Feb. 19-22, 2014.

Mal, S. et al., "Electric vehicle smart charging and vehicle-to-grid operation", International Journal of Parallel, Emergent and Distributed Systems, 27(3), pp. 249-265, Mar. 2012, Bristol, PA.

Nazaripouya, Hamidreza et al., "Battery Energy Storage System Control for Intermittency Smoothing Using an Optimized Two-Stage Filter", IEEE Transactions on Sustainable Energy, vol. 9, No. 2, Apr. 2018, published Sep. 20, 2017.

ISA/US, United States Patent and Trademark Office (USPTO), International Search Report and Written Opinion dated Sep. 28, 2017, related PCT international application No. PCT/US2017/ 033030, pp. 1-10, claims searched, pp. 11-19.

* cited by examiner

BATTERY ENERGY STORAGE CONTROL SYSTEMS AND METHODS FOR A GRID TIE INVERTER COUPLED TO A PHOTOVOLTAIC SYSTEM

CROSS-REFERENCE TO RELATED APPLICATIONS

This application claims priority to, and is a 35 U.S.C. § 111(a) continuation of, PCT international application number PCT/US2017/033030 filed on May 17, 2017, incorporated herein by reference in its entirety, which claims priority to, and the benefit of, U.S. provisional patent application Ser. No. 62/337,949 filed on May 18, 2016, incorporated herein by reference in its entirety. Priority is claimed to each of the foregoing applications.

The above-referenced PCT international application was published as PCT International Publication No. WO 2017/201125 A1 on Nov. 23, 2017, which publication is incorporated herein by reference in its entirety.

STATEMENT REGARDING FEDERALLY SPONSORED RESEARCH OR DEVELOPMENT

This invention was made with Government support under Grant Number DE-OE0000192, awarded by the U.S. Department of Energy. The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to battery power management and more particularly to battery power management using both local and remote controllers connected through the internet.

2. Background Discussion

Battery Management Systems (BMS) have been studied extensively in the literature. A BMS usually provides features such as Cell monitoring, Battery Safety and Protection, State of Charge (SOC) Estimation, State of Health (SOH) Estimation, Cell Balancing, Thermal Management, Charging Control. The BMS technology should not be confused with the technology of the presented disclosure.

Energy Management Systems (EMS) are another area of research which gained huge amount of attraction. Energy management researches are divided in two different areas. The first area is related to building and organizational energy management system. In this category, the goal of EMS is to match energy generation with consumer needs. In fact, this problem is optimization problem, where the anticipation control layer tries to maximize the total satisfaction of services and, at the same time, minimize the total energy cost.

The second area investigates large scale EMS (whole system EMS), such as micro-grid energy management or utility owned EMS. Whole system EMS refers to managing systems generation, transmission, distribution, and loads to fulfill operator's needs. Whole system EMS is what utility companies do to ensure that their power stations and renewable energy sources generate enough energy to meet the demand. It also refers to techniques for managing and controlling customer's levels energy. In addition, it is a major part of controlling and optimizing Micro-grids operation.

Under this context, the EMS might not necessary include the storage systems such as battery to be controlled. In addition, EMS systems are involved with scheduling optimization and normally do not take to the account the dynamic of the system and real time control.

Battery energy storage system control is also investigated in the literature. Several control strategies and configurations for battery energy storage system have been proposed to smooth power fluctuation or enhance power quality. Battery energy storage systems recently have begun to be controlled for multiple applications such as frequency regulation, voltage regulation, grid stabilization, transmission loss reduction, diminished congestion, increased reliability, wind and solar energy smoothing, spinning reserve, peak-shaving, load leveling, uninterruptible power sources, grid services, electric vehicle (EV) charging stations, and others.

BRIEF SUMMARY

This disclosure pertains generally to battery energy storage control systems and methods, and more particularly to a top level controller that manages the behavior of an entire battery storage system. In various embodiments, the technology may manage battery modules, and power electronics in a grid. The technology may also be configured to communicate with BMS as one component of the system.

In another embodiment, the technology focuses on real time dynamic control of a battery energy storage system (BESS).

By way of example, this technology as referred to as "battery dynamic power flow control". Aspects of this technology may include, but are not limited to, the following: (1) this system addresses the localization of solar renewable energy sources; (2) the system optimizes the size of battery capacity; (3) the system both shifts the power consumption pattern and shapes the power consumption profile in real time; and (4) the system provides the grid services including but not limited to voltage regulation.

In one embodiment, the battery dynamic power flow control system described herein transforms a battery storage system from a passive component in the grid to an active and smart component which is able to benefit grid and users automatically. The control system may address needs of the following targets, as well as others, by controlling the power flow to:

1. Customers: including residential, commercial, and enterprise entities: Reducing the electricity bills, localize and increase the solar utilization, participate in arbitrage; Demand charge reduction, Backup power, Time-of-use bill management;

2. Utilities: maximum utilization of renewables, providing the spinning reserve; resource adequacy, transmission deferral, distribution deferral, transmission congestion relief; and 3. Grid Operators: frequency regulation, voltage support, energy arbitrage, spin/non-spin reserve, black start, shifting the peak demand, shaping demand, balancing renewables, load leveling.

There are some products in the market that are performing energy battery energy storage control such as STEM, RepositPower, Green Charge Networks and Coda Energy products. Although they may appear similar, they (1) do not address the localization of solar, (2) are not optimized the size of battery capacity, and (3) are not shaping the power consumption profile, but only shifting the power consumption pattern.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

By way of example, and not of limitation, this disclosure describes a battery energy storage control system which may enable the battery storage to function in one or more of the following ways: (1) to communicate with power electronic devices, measurement units, central controller, local controller and any other interface equipment, (2) to intelligently operate in the grid network to support the grid and assist users saving money automatically, and (3) to operate safely.

In one embodiment, the control system includes both hardware and software operable on the hardware as follows:

A. Hardware:

The control system hardware comprises two parts: (1) local controller hardware, and (2) central controller hardware. Other miscellaneous hardware is used to monitor various voltages, phases, and currents. Safety mechanisms are also implemented to protect the system from catastrophic and other faults.

The local controller hardware comprises a microcontroller, analog and digital input/output, communication interface (Modbus TCP, Modbus RTU), local memory, power supply, and suitable protection equipment (circuit breaker).

Figure 1:
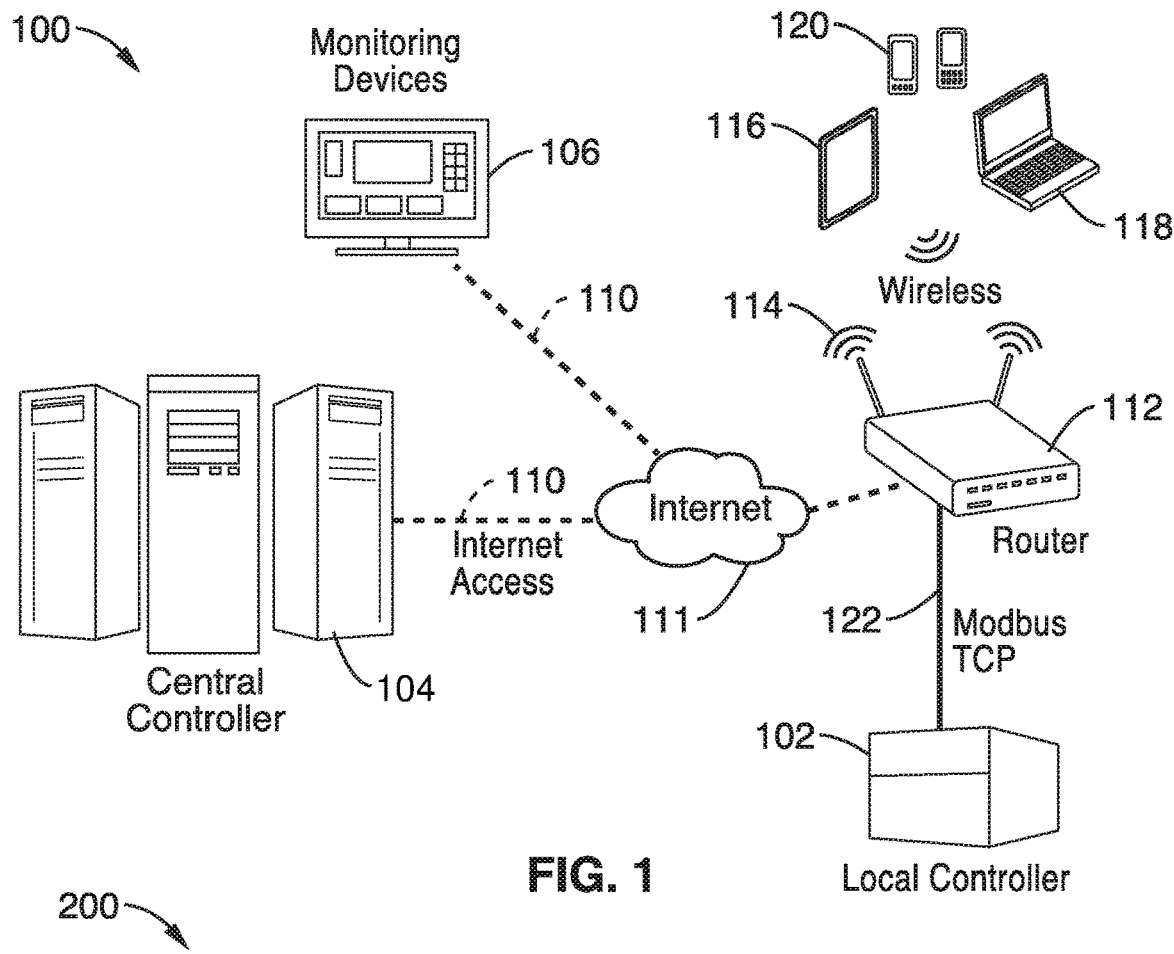
FIG. 1 is a diagram of a central controller that includes a central controller and monitoring equipment in one embodiment, interconnected through the internet.

Refer now to FIG. 1, which is a diagram 100 of a local controller 102 that connected to a central controller 104 (possibly more commonly known as a server, but here with specialized software) and monitoring equipment 106 in one embodiment, interconnected through the internet cloud 108. Some connections 110 may be through direct wired or fiber optic connections 110 using common TCP/IP protocols.

Additionally, one or more Wi-Fi routers 112 may provide wireless 114 connections to tablets 116, laptops 118, or other devices 120. The local controller 102 may be connected over traditional TCP/IP, or over a Modbus TCP 122 connection to the Wi-Fi router 112. Basically, all hardware connects through the internet cloud 108 in a manner allowing suitable intercommunication.

Figure 2:
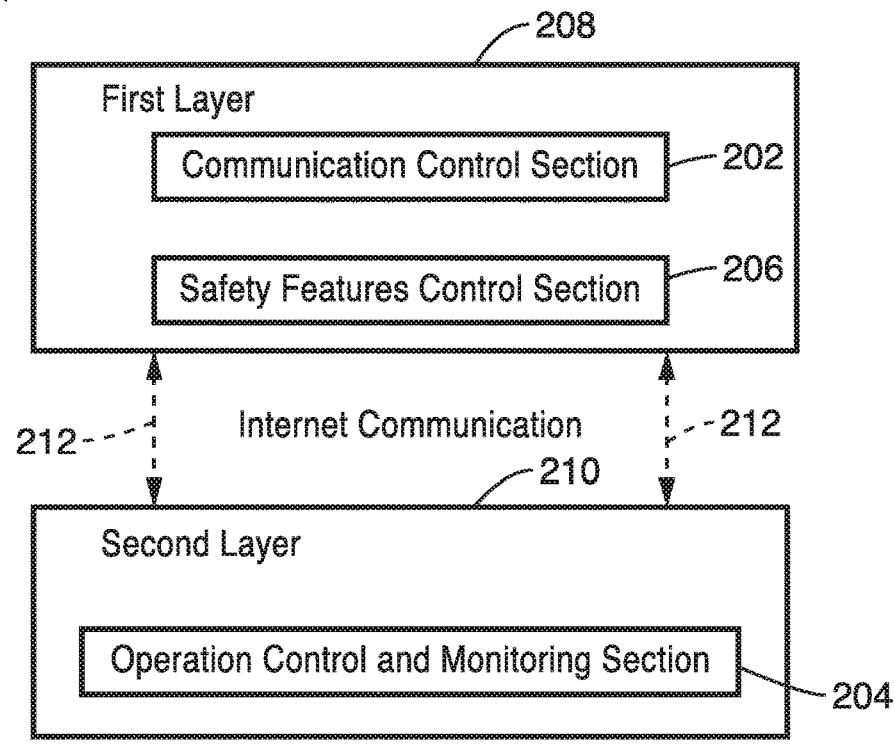
FIG. 2 is a block diagram of a control system of the present embodiment that comprises three software sections: (1) communication control, (2) operation control, and (3) safety features control.

B. Software:

Refer now to FIG. 2, which is a block diagram 200 of the control system software that comprises three sections: (1) a communication control section 202, (2) an operation control and monitoring section 204, and (3) a safety features control section 206.

1. Communication Control Section:

The communication control section 202 is responsible for communication of the control system with other components that are associated with a battery storage system such as power electronic devices, measurement units, central controller, local controller, safety equipment and etc. Different components normally communicate under different communication protocols. Therefore, this section provides a common platform that enables intercommunication between different hardware components of a battery storage system.

2. Operation Control Section:

The operation control and monitoring section 204 is responsible for intelligent operation of the battery storage system in real time. The control system is designed such that the battery storage system is able to support the grid in many fashions, including but not limited to: load leveling, improving power reliability, solving the duck curve challenge, regulating the voltage and frequency of the grid, improving power quality, improving angular stability (transient stability) of the grid, compensating unbalanced load, black start, providing spin/non-spin reserve, solving solar energy curtailment, resource adequacy, transmission deferral, and distribution deferral.

In addition, the operation control section 204 enables the battery storage system to benefit the users in manners including, but not limited to: power demand peak shifting, power demand shaping, localization the solar energy, backup power, time-of-use bill management, participate in arbitrage which all lead to reducing the electricity bill.

The above features can be selected based on the application of the connected battery storage system to the grid.

3. Safety Features Control Section:

The safety features control section 206 monitors and controls the required criteria for safe operation of battery storage system and power electronic devices. These criteria include, but are not limited to, over-temperature of battery modules, overcurrent charging and discharging, undervoltage, overvoltage, ventilation problems, cell imbalances, state of the health degradation, short circuits, and ground faults. Should any violation of these preceding criteria occur in the system, then the safe features control section 206 performs any required actions to resolve the problem, otherwise the operation of the system would be stopped immediately in the interests of systemic safety.

The control software has dual layer architecture. The first layer 208 includes the communication control section 202 and safety feature control section 204, which are located on the local controller (102 of FIG. 1). The second layer 210 involving the operation control section 204 is located on central controller side, and additionally allows for overall system monitoring.

Each layer may be written in different programming language and run in different environments. This architecture increases the speed and performance of the system as local and central control is able to perform the required computational and executional tasks in parallel. This FIG. 2 shows one embodiment of the software architecture of the control system, where the first layer 208 and the second layer 210 are interconnected by internet 212 communication.

Refer now to FIG. 1 and FIG. 2. The second layer 210 may be located on both the local controller 102 and the central controller 104. Generally, the central controller 104 allows for overall system monitoring, and the local controller 102 allows for partial monitoring, however, these local and central designations are somewhat fluid, and may be moved as desired.

Figure 3A:
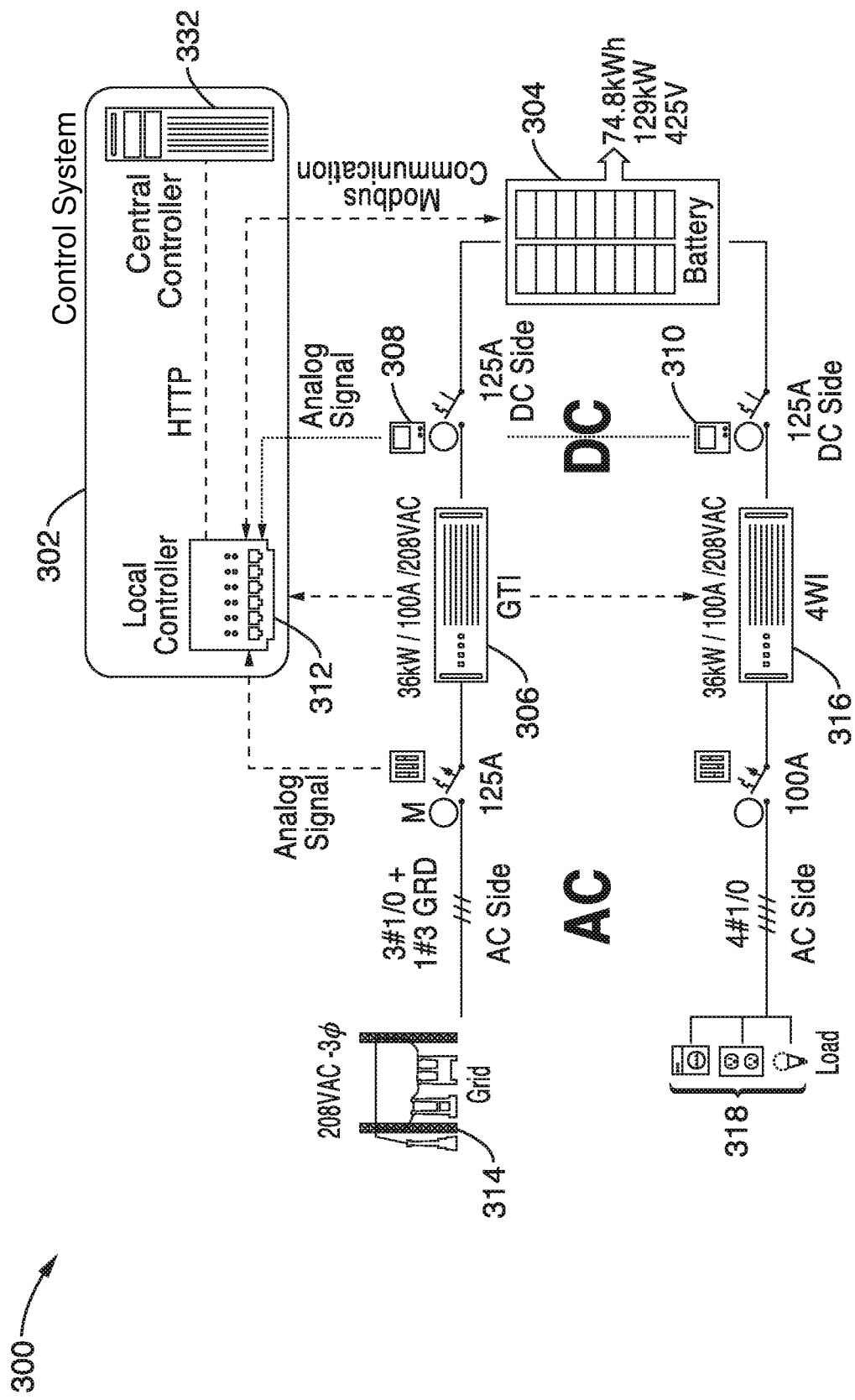
FIG. 3A is a schematic of the battery energy storage system (BESS) and integrated control system according to an embodiment of the presented technology where the system includes controlling grid to local load power.
Figure 3B:
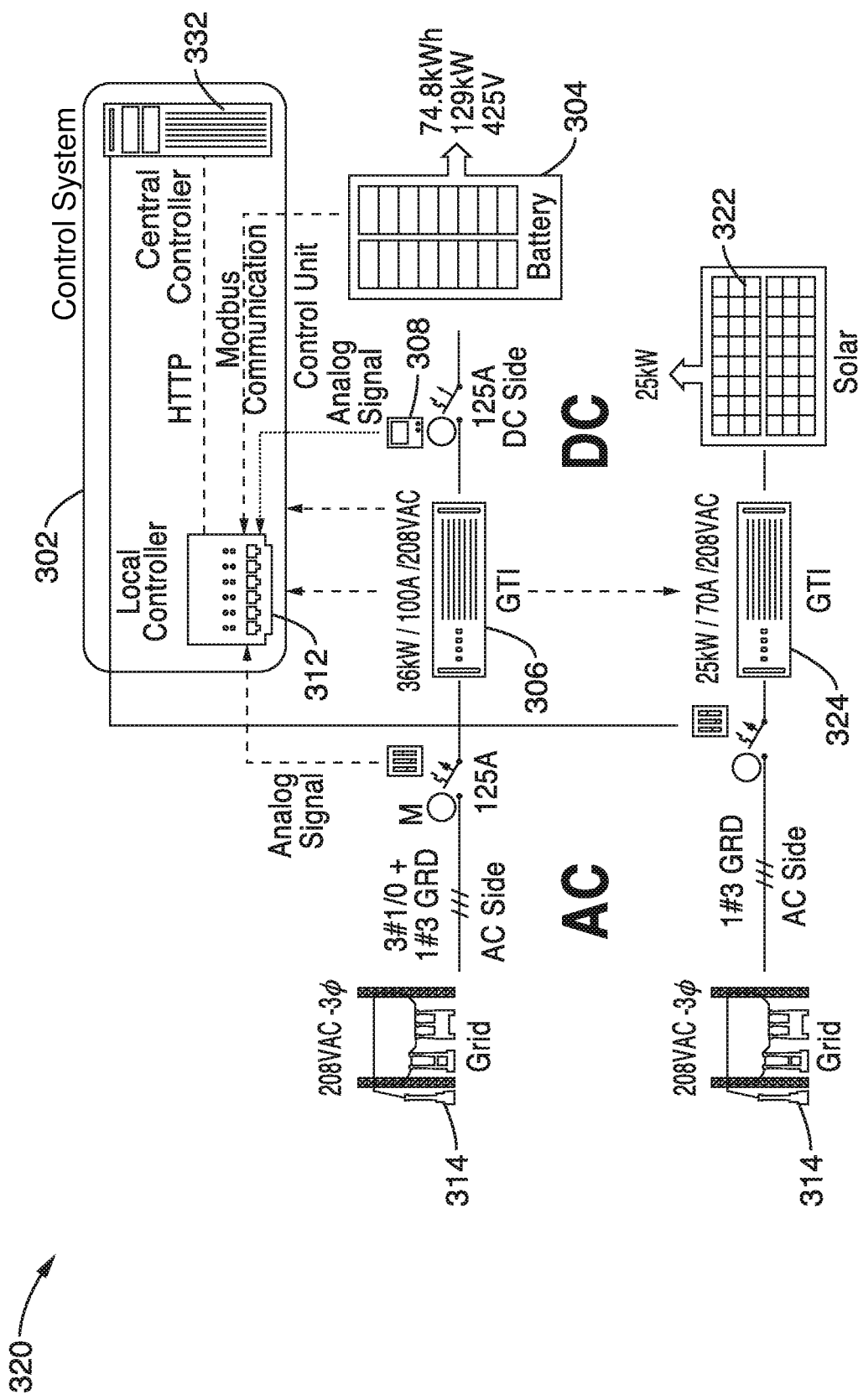
FIG. 3B is a schematic of the battery storage system and integrated control system according to an embodiment of the presented technology where the system includes controlling solar panel output.
Figure 3C:
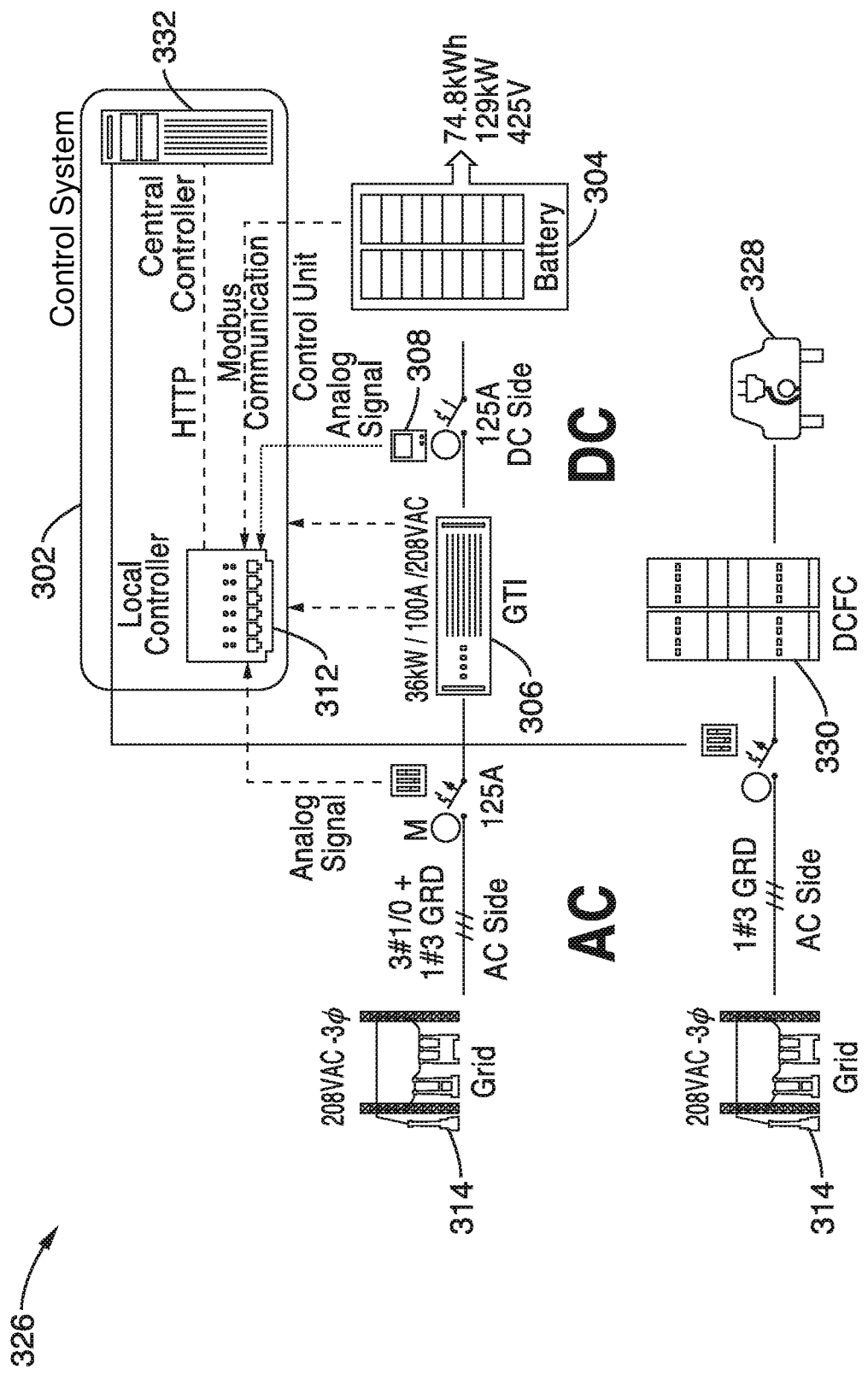
FIG. 3C is a schematic of the battery storage system and integrated control system according to an embodiment of the presented technology where the system includes controlling DC Fast Charging (DCFC) output.
Figure 4A:
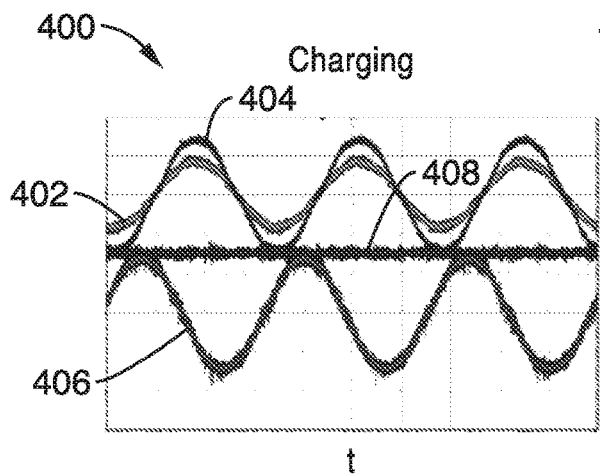
FIG. 4A is a graph of the battery energy storage system (BESS) according to an embodiment of the presented technology, where BESS is charging the batteries.
Figure 4B:
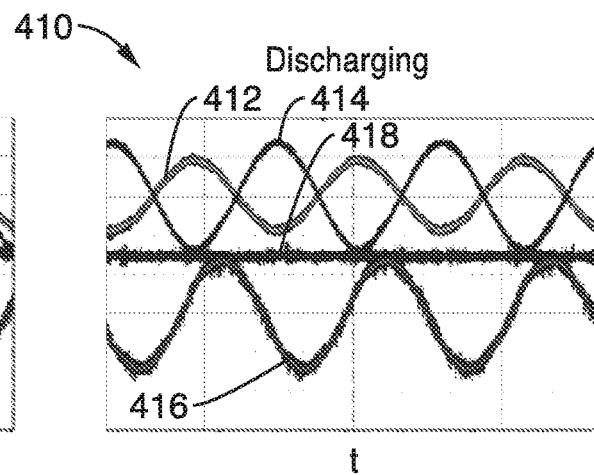
FIG. 4B is a graph of the battery energy storage system (BESS) according to an embodiment of the presented technology, where BESS is discharging the batteries.
Figure 4C:
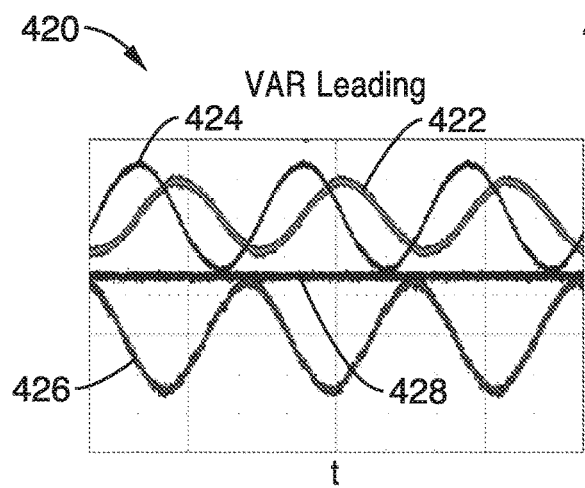
FIG. 4C is a graph of the battery energy storage system (BESS) according to an embodiment of the presented technology, where BESS is controlling reactive power by VAR leading.
Figure 4D:
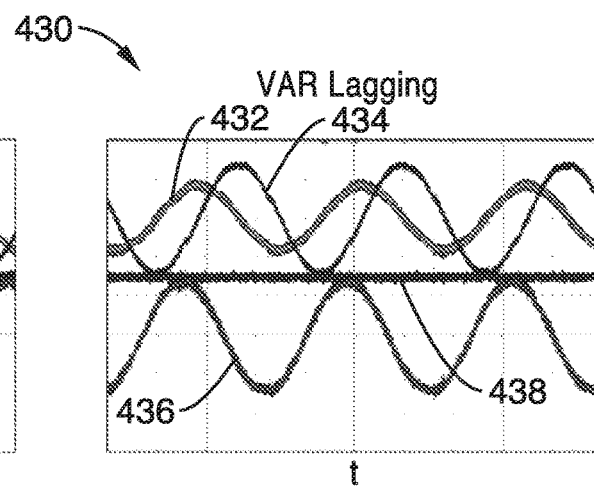
FIG. 4D is a graph of the battery energy storage system (BESS) according to an embodiment of the presented technology, where BESS is controlling reactive power by VAR lagging.

Refer now to FIG. 3A through FIG. 3C. Here, FIG. 3A is a schematic of the battery energy storage system (BESS) 300 and battery control system 302 according to an embodiment of the presented technology where the system includes control of either: 1) a grid-connected mode to supply grid load, or 2) an islanded mode to supply the local load.

The technology incorporates control techniques, machine learning algorithms, and optimization methods in form of an integrated control system to make the battery energy storage system (BESS) intelligent in a grid implementation. The control system 302: 1) manages the communication between battery management system (BMS) 304, grid-tie inverter 306, measurement units 308 and 310, and local controller 312, 2) controls the active and reactive power flow of BESS 300 in real time such that the system be able to operate in four quadrants according to present power situations, and 3) supervises the safe operation of the system.

Generally speaking, the BESS 300 communicates with a battery source 304, allowing for control and monitoring of the battery source 304. Power supplied by the BMS is initially DC, and is inverted to Alternative Current (AC) through a grid tie inverter (GTI) 306, and thence connected to the grid 314. When the control system 302 detects that the batteries require charging, the GTI 306 operates as a DC charger to charge the battery source 304, with power supplied from the grid 314. Similarly, when the control system 302 detects that the batteries require discharging, the GTI 306 operates as inverter to supply power to the grid 314 from the battery source 304.

The battery source 304 may also supply power to a 4-wire inverter (4WI) 316, which in turn supplies local load 318.

FIG. 3B is a schematic 320 very similar to that of FIG. 3A, however with the addition of a solar (photovoltaic) source 322. Here, the solar 322 source may be inverted through a second grid tie inverter (GTI) 324 to supply power to the grid 314. Battery source 304 may be used to exchange power through the initial GTI 306. Here, the potential power connection between the solar 322 source and the battery source 304 would ultimately occur through the grid 314.

Finally, FIG. 3C is a schematic 326 also very similar to that of FIG. 3A and FIG. 3B; however with the substitution of an electric vehicle 328 attached to the system through a DC Fast Charging (DCFC) 330 output. In this embodiment, grid 314 power is used to supply power to the DC Fast Charging (DCFC) 330 to thereby charge the electric vehicle 328.

Refer now to FIG. 2, and FIG. 3A through FIG. 3C. In all of FIG. 3A through FIG. 3C above, a part of the control system contains a server, or central controller 332. This central controller 332 performs the various second layer 210 of FIG. 2 operations, including the overall operation control and monitoring section 204. The communication control section 202 and safety features control section 206 may occur in the first layer 208 on the local controller 312 in real time.

The software has already been developed and integrated into a grid connected battery energy storage system (BESS) in a laboratory environment. The system commissioning has been accomplished and currently the system is operational with concurrent data collection and analysis being performed.

Refer now to FIG. 4A through FIG. 4D, which are graphs of four modes of battery energy storage system (BESS) operation that shows the captured voltage and current versus time during:

1) charging mode 400, with phase A line-to-neutral voltage 402 (~120 V rms), phase A 404 and B 406 current (at ~100 A rms), and the DC bus 408 voltage (~355 V DC);

2) discharging mode 410, with phase A line-to-neutral voltage 412 (~120 V rms), phase A 414 and B 416 current (at ~100 A rms), and the DC bus 418 voltage (~355 V DC);

3) leading mode 420, with phase A line-to-neutral voltage 422 (~120 V rms), phase A 424 and B 426 current (at ~100 A rms), and the DC bus 428 voltage (~355 V DC); and 4) lagging mode 430, with phase A line-to-neutral voltage 432 (~120 V rms), phase A 434 and B 436 current (at ~100 A rms), and the DC bus 438 voltage (~355 V DC).

Software Overview

The software benefits from an advanced discrete signal processing (DSP) algorithm that is optimized over the size of required battery energy storage system (BESS). A close loop control strategy is employed to increase the accuracy of the real time control.

The control algorithm has already been developed in form of software and programmed into the controller. This software enables the local controller to communicate with a battery management system (BMS) and a grid-tie inverter (GTI), and collects data from a measuring unit to maintain safe control and efficient operation. The local controller handles the handshake process between the battery energy storage system (BESS) and the inverters before power transfer occurs.

The software enables the controller to remotely control devices through the local network and Internet. The system can operate in four quadrants (e.g. charging, discharging, VAR leading, and VAR lagging, as previously shown in FIG. 4A through FIG. 4D), which provides the capability to control the reactive and active power to compensate for the challenges involved in integrating solar energy and electric vehicles; in particular, the system injects and absorbs active and reactive power based on the policy that the controller determines for the system.

The system software has been tested over some scenarios in a laboratory setting. Currently three applications are adopted and solar localization is under testing: 1) power generation/demand shifting, 2) power generation/demand shaping, and 3) voltage regulation, each of which are further explained below.

Example 1

For power generation/demand shaping the real-time control algorithm is applied to solar power generation with many fluctuations.

Figure 5:
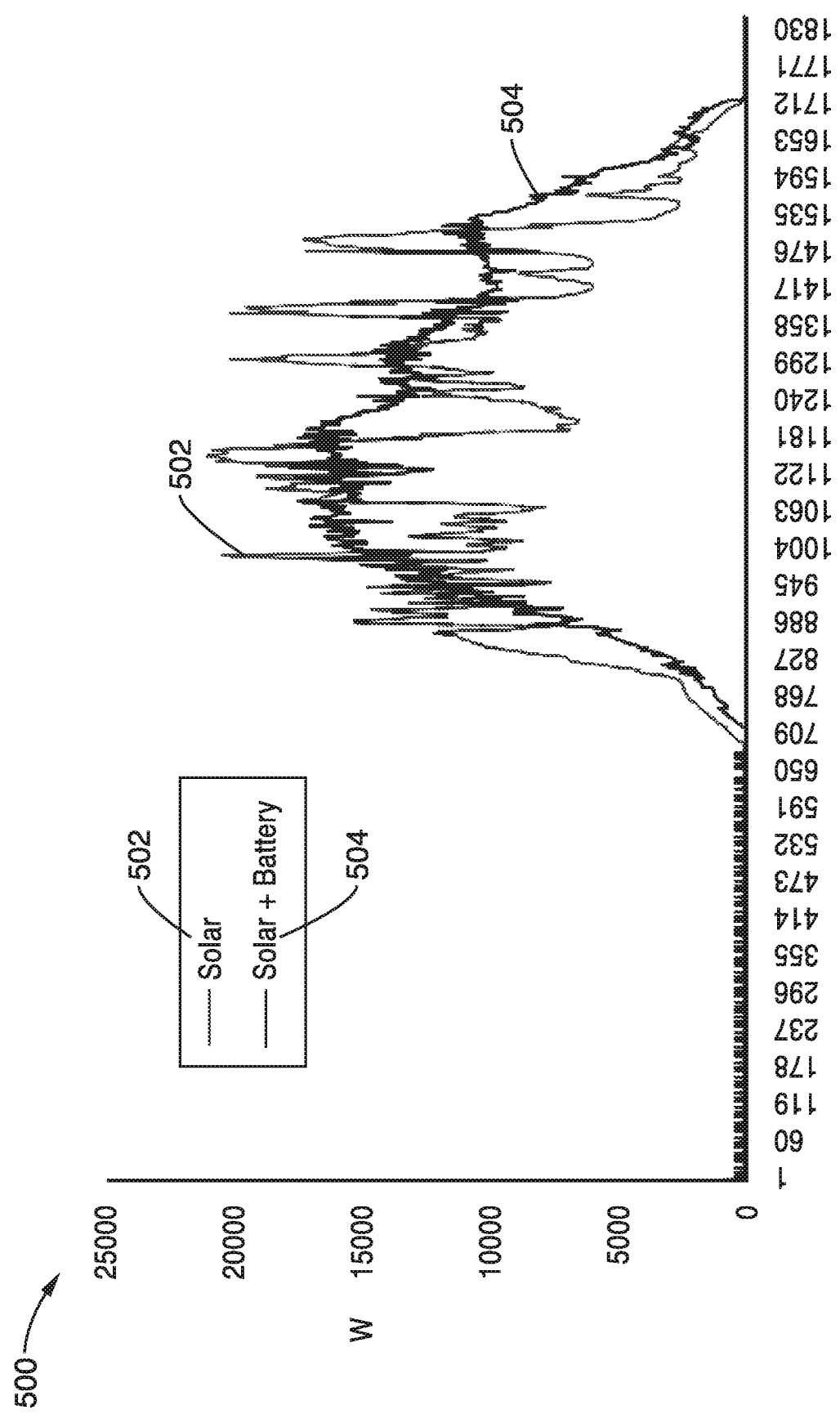
FIG. 5 is a graph of output power seen by the grid in W versus minutes according to an embodiment of the presented technology incorporating solar power.
Figure 6:
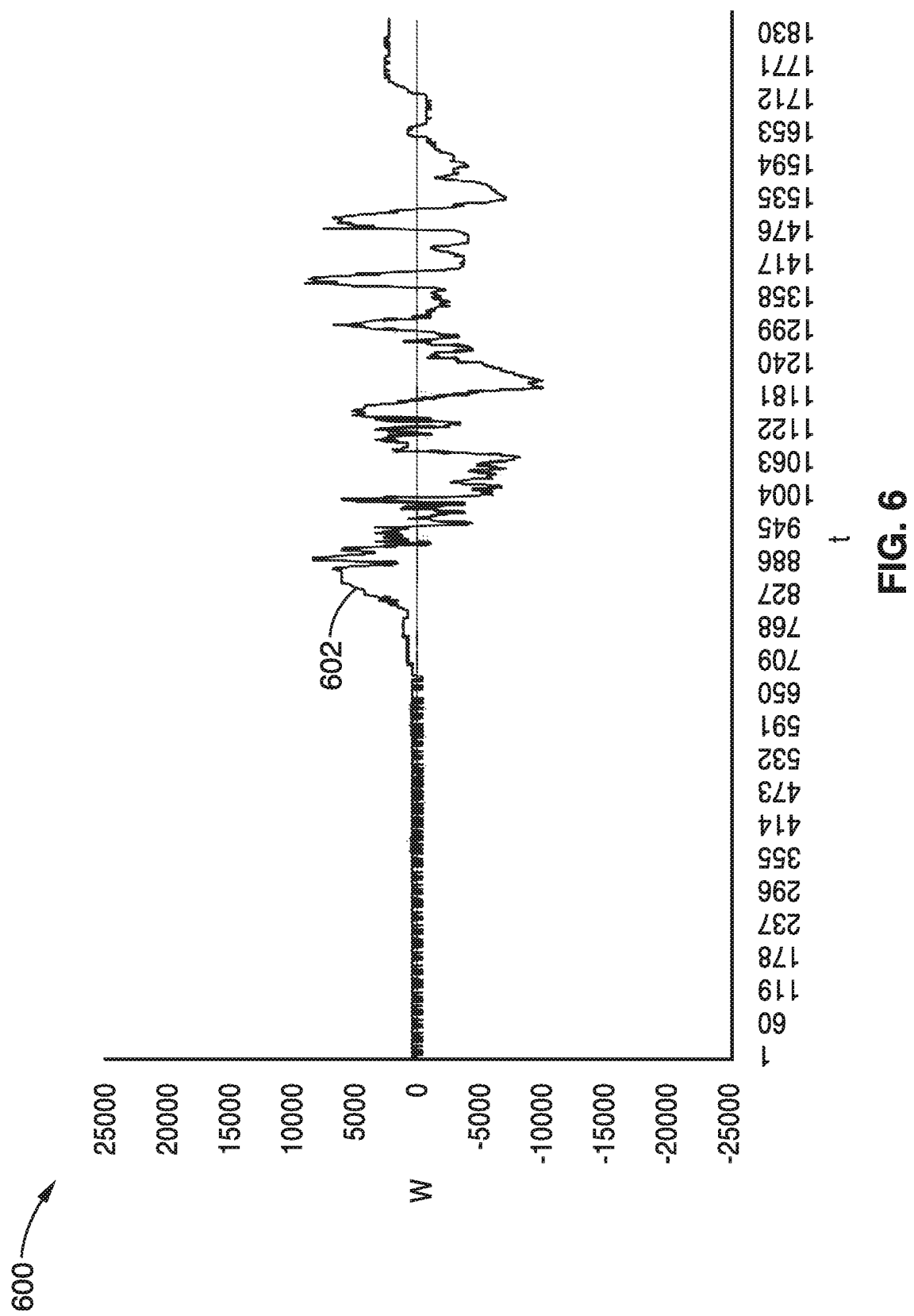
FIG. 6 is a graph of battery power flux in W versus minutes according to an embodiment of the presented technology.

Refer now to FIG. 5 and FIG. 6. FIG. 5 is a graph 500 of output power in W versus minutes that shows the shaping capability of software for smoothing solar power fluctuations on a typical day, using data obtained from solar panels. Here, the output power of the solar system 502 and the ones of the solar and battery system 504 are shown.

FIG. 6 is a graph 600 of battery power flux in W versus minutes. Here, the curve 602 shows the performance of battery storage system. The advantage of this method is that at the end of the day the state of charge of battery doesn't change.

From the FIG. 5, there can be seen some fluctuations in the output power, due to the computational and execution delays of the controller and devices, but the root-mean-square deviation (RMSD) or root-mean-square error (RMSE) show 86% improvement in smoothing the fluctuation by employing the described software. Despite these results, research continues on how to decrease solar power fluctuations.

It should be noted that, theoretically, one does not expect to dampen completely these fluctuations due to the existing delay (currently 3 s) in the control system including control computational and executional delays; thus, a 100% success of damping the fluctuation in a future physical system cannot be expected.

Figure 7:
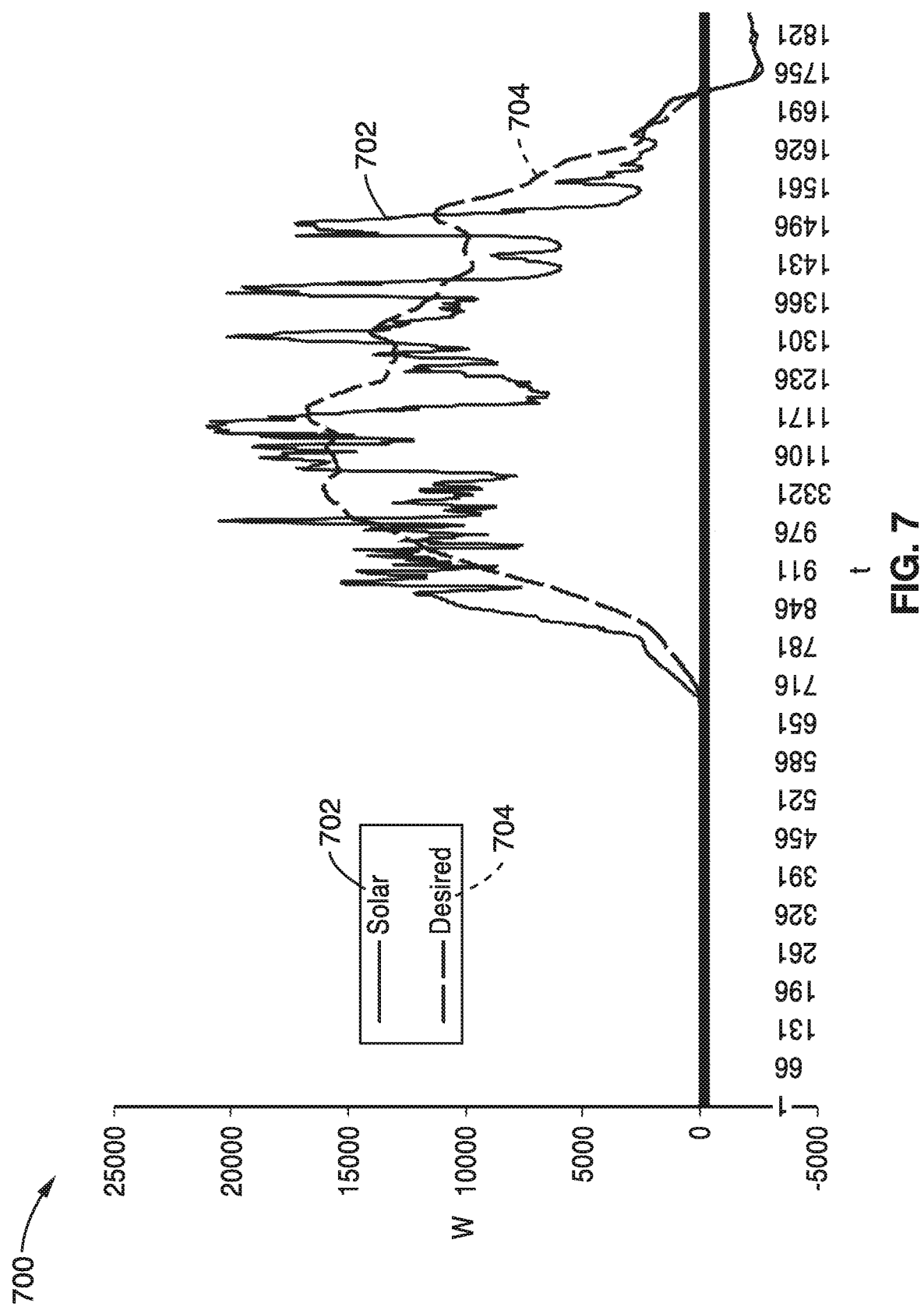
FIG. 7 is a graph of solar output and desired output according to an embodiment of the presented technology.

Refer now to FIG. 7, which is a graph 700 of solar 702 output and desired 704 output. The desired 704 output is an ideal target of smoothed solar. However, this target as mentioned before is not theoretically accessible in practice due to the nature of physical components that include delay. Although, there are some techniques such as prediction and state estimation or high sampling rate that can be employed to reduce the delay effect.

1.1 Theory Development.

This technology employs three separate topics to fulfill the real time solar shaping: 1) discrete signal processing theorems, 2) optimization algorithms, and 3) prediction techniques. Various algebraic theorems will be used to develop this technology. Discrete signal process (DSP) theory is utilized to develop a finite-duration impulse response (FIR) filter in discrete time domain that is able to shape the sampled input signal in real time. The optimization algorithm is used to optimize the filter designed in the last section such that minimizes the size of required battery. Finally, the prediction techniques help to reduce the delay effect and improve the performance of the system.

1.2 Discrete Signal Processing.

This section is concerned with designing a filter that is able to smooth the solar output power in real time. In practice, the desired filter is generally implemented with digital computation and used to filter a discrete signal that is derived from continuous-time signal by means of periodic sampling and measurement. Therefore, most often the underlying design techniques relate only to the discrete-time nature of the signals which makes it common to use a discrete-time filter (digital filter).

In this application the finite-duration impulse response (FIR) filter is preferred because DSP micro-computers generally have arithmetic capabilities which are designed for accumulating sums of products. These capabilities are rather perfectly matched with FIR filter requirements and structure. In addition, the design problem for FIR filter is much more under control than a corresponding infinite-duration impulse response (IIR) design problem, because of the existence of an optimality theorem for the FIR filter that is meaningful in a wide range of practical situations.

The focus of this section is on designing the "minimum phase" FIR filter, which refers to systems that are causal and stable and that have a causal and stable inverse. The motivation for designing the minimum phase filter is related to some properties that these type of filters offer. These properties are expanded below.

1.2.1 The Minimum Phase-Lag Property.

The use of the terminology "minimum phase" as a descriptive name for a system having all its poles and zeros inside the unit circle. Recall that, the continuous phase, i.e., $\arg[H(e^{j\omega})]$ of any nonminimum-phase system can be expressed as $$\arg[H(e^{j\omega})]=\arg[H_{min}(e^{j\omega})]+\arg[H_{ap}(e^{j\omega})] \quad (1)$$

Therefore, the continuous phase that would correspond to the principal-value phase is the sum of the continuous phase associated with the minimum-phase function and the continuous phase of the all-pass system associated with the principal-value phase.

The continuous-phase curve of an all-pass system is negative for $0 \leq \omega \leq \pi$. Thus, the reflection of zeros of $H_{min}(Z)$ from inside the unit circle to conjugate reciprocal locations outside always decreases the (continuous) phase or increases the negative of the phase, which is called the phase-lag function. Hence:

Theorem 1: the causal, stable system that has $|H_{min}(e^{j\omega})|$ as its magnitude response and also has all its zeros (and, of course, poles) inside the unit circle has the minimum phase-lag function (for $0 \leq \omega \leq \pi$) of all the systems having that same magnitude response.

Therefore, a more precise terminology is a minimum phase-lag system, but the term "minimum phase" is historically the established terminology.

1.2.2 The Minimum Group-Delay Property.

First note that the group delay for the systems that have the same magnitude response is $$grd[H(e^{j\omega})]=grd[H_{min}(e^{j\omega})]+grd[H_{ap}(e^{j\omega})] \quad (2)$$

where "grd" is the group delay operator.

The group delay for the minimum-phase system is always less than the group delay for the nonminimum-phase system. This is because the all-pass system that converts the minimum-phase system into the nonminimum-phase system has a positive group delay. This is a general property of all-pass systems; they always have positive group delay for all $\omega$. Thus:

Theorem 2: among all the systems that have a given magnitude response $|H_{min}(e^{j\omega})|$, the one that has all its poles and zeros inside the unit circle has the minimum group delay.

An equally appropriate name for such systems would therefore be minimum group-delay, or low-group-delay systems, but this terminology is not generally used.

1.2.3 The Minimum Energy-Delay Property

Theorem 3: for any causal, stable sequence h[n] for which $$|H(e^{j\omega})|=|H_{min}(e^{j\omega})| \text{ then: } |h[0]|<|h_{min}[0]|$$

All the impulse responses whose frequency-response magnitude is equal to $|H_{min}(e^{j\omega})|$ have the same total energy as $h_{min}[n]$, since, by Parseval's theorem, $$\sum_{m=0}^{\infty}|h[m]|^2 = \quad (3)$$

$$\frac{1}{2\pi}\int_{-\pi}^{\pi}|H(e^{j\omega})|^2 d\omega = \frac{1}{2\pi}\int_{-\pi}^{\pi}|H_{min}(e^{j\omega})|^2 d\omega = \sum_{m=0}^{\infty}|h_{min}[m]|^2$$

If one defines the partial energy of the impulse response as $E[n]=\sum_{m=0}^{n}|h[m]|^2$ then it can be shown that $$\sum_{m=0}^{n}|h[m]|^2 \leq \sum_{m=0}^{n}|h_{min}[m]|^2 \quad (4)$$

for all h[n] belonging to the family of systems that have the magnitude response $|H(e^{j\omega})|=|H_{min}(e^{j\omega})|$. According to (4), the partial energy of the minimum-phase system is most concentrated around n=0; i.e., the energy of the minimum-phase system is delayed the least of all systems having the same magnitude response function. For this reason, minimum-phase (lag) systems are also called minimum energy-delay systems, or simply, minimum-delay systems.

In general, the minimum energy delay occurs for the system that has all its zeros inside the unit circle (i.e., the minimum-phase system) and the maximum energy delay occurs for the system that has all its zeros outside the unit circle.

The technology utilizes the above theorems to minimize the delay in real time application and minimize the size of required battery storage system in order to achieve the same smoothing performance. Knowing that the minimum phase filter with the mentioned properties is best suited for the present application, the optimization algorithm and theorem are employed to design the optimal minimum phase filter.

1.3 Optimization

This section describes how the minimum phase filter is designed by employing an optimization algorithm and appropriate theory and background. Such a design provides the optimum solution of employing the minimum size of battery for desirable smoothing performance.

Definition 1 (group delay): Typically, it is hard to infer much from a phase plot, while a group delay plot gives more useful information Group delay is defined as shown in (5).

$$\tau(\omega) = grd[H(e^{j\omega})] = -\frac{d}{d\omega}[\arg H(e^{j\omega})] = -\frac{d}{d\omega}[ARG\ H(e^{j\omega})]. \quad (5)$$

The last equality holds except at discontinuities of [ARG $H(e^{j\omega})$]. In the amplitude/phase representation:

$$H(e^{j\omega})=A(\omega)e^{j\Theta(\omega)} \quad (6)$$

Differentiating both sides of (6) yields:

$$H'(e^{j\omega})=A'(\omega)e^{j\Theta(\omega)}+A(\omega)e^{j\Theta(\omega)}(j\Theta'(\omega)) \quad (7)$$

$$\frac{A'(\omega)}{A(\omega)}$$

Dividing (7) by (6), since both $$\tau(\omega) = -\text{Im}\left[\frac{H'(e^{j\omega})}{H(e^{j\omega})}\right]. \quad (8)$$

and $\Theta'(\omega)$ are real,

If $h(n) \leftrightarrow H(e^{j\omega})$ one can apply the frequency differentiation property of the Fourier transform and yield $-jnh[n] \leftrightarrow H'(e^{j\omega})$.

Denoting Fourier transform of h[n] as F.T.(h[n]), $$\tau(\omega) = -\text{Im}\left[\frac{F.T.(-jnh[n])}{F.T.(h[n])}\right] \quad (9)$$

and finally, $$\tau(\omega) = \text{Real}\left[\frac{F.T.(nh[n])}{F.T.(h[n])}\right]. \quad (10)$$

The desire is to design the filter such that it has the minimum possible group delay at passband to make its response fast. For this purpose the preferred approach to make group delay at $\omega=0$ equal to zero, yielding $$\tau(0) = \text{Real}\left[\frac{F.T.(nh[n])}{F.T.(h[n])}\right] = 0 \leftrightarrow nh[n] = 0. \quad (11)$$

There is still another theorem that will help to define the optimization problem.

Theorem 4: Let $B_0, B_1, \ldots, B_n$ be complex scalars (with $B_1, \ldots, B_n$ not all zero) and consider the affine family of polynomials $$P = \left\{z^n + a_1 z^{n-1} + \ldots + a_{n-1}z + a_n : B_0 + \sum_{j=1}^{n} B_j a_j = 0, a_i \in C\right\}. \quad (12)$$

The optimization problem $$\rho^* := \inf_{p \in P} \rho(p) \quad (13)$$

where $\rho(p)$ denotes the root radius of a polynomial p, $$\rho(p) = \max\{|z| : p(z) = 0, z \in C\} \quad (14)$$

has a globally optimal solution of the form $$p^*(z) = (z-\gamma)^n \in P \quad (15)$$

with $p^* = \gamma$.

The theorem describes that making all the coefficients of polynomial equal to zero ($a_1 = \ldots, a_{n-1} = a_n = 0$) leads to $z^n$ with the maximum root radius ($\gamma$) equal to zero. Therefore, since problem in Theorem 4 is a convex optimization problem, by minimizing the coefficients of the polynomial one can move toward the zero root radius of the problem. In other words, the radius of polynomials roots will be reduced by minimizing the polynomial coefficient ($a_1, \ldots, a_{n-1}, a_n$) while $$B_0 + \sum_{j=1}^{n} B_j a_j = 0.$$

This approach will help to push polynomial roots inside the unit circle that is the requirement of the minimum phase filter.

In addition, equation (16) represents the group delay contribution of a zero $(1-re^{j\theta}e^{-j\omega})$ in the filter transfer function $$grd(1 - re^{j\theta}e^{-j\omega}) = \frac{r^2 - r\cos(\omega - \theta)}{1 + r^2 - 2r\cos(\omega - \theta)} \quad (16)$$

where r is the radius of the zero and $\theta$ is the angle in the z-plane.

The maximum amount of group delay for each zero happens when $\omega - \theta = \pi$ thus:

$$\max(grd) = \frac{r}{1+r}. \quad (17)$$

Therefore, minimizing the polynomial coefficient and consequently reducing the roots of polynomial (r) eventually decreases the group delay, which is desirable.

As the result, consider the FIR filter described by $$H(e^{j\omega}) = \sum_{n=0}^{N} h[n] e^{-j\omega n}.$$

The design variables are coefficients h[n]. The problem will explore the design of a low-pass filter, with specifications:

1. For $\omega=0$ the magnitude of the filter should be equal to one $$\left(H(e^{j0}) = \sum_{n=0}^{N} h[n] = 1\right).$$

2. For $\omega_c \leq \omega \leq \pi$ the magnitude of the filter should be minimized $$\left(\min|H(e^{j\omega})| = \left|\sum_{n=0}^{N} h[n] e^{-j\omega n}\right|\right)$$

where $\omega_c$ is the cutoff frequency.

3. For $\omega=0$ the group delay should be zero to have no delay for DC component and low frequency $$\left(\sum_{n=0}^{N} nh[n] = 0\right).$$

4. The coefficient of the filter should be minimized to guarantee the minimum phase filter with minimum group delay (min h[n] for n=1, ..., (N−1)).

Finally the optimization problem can be express as:

$$\text{minimize } norm\left(\sum_{n=0}^{N} h[n] e^{-j\omega n}\right) + \alpha \times norm\left(\sum_{n=0}^{N-1} h[n]\right) \quad (18)$$

Subject to:

$$\sum_{n=0}^{N} h[n] = 1, \sum_{n=0}^{N} nh[n] = 0$$

Where $\alpha$ is a weighting factor which is changing in a loop to make sure that all roots are placed inside the unit circle to achieve a minimum phase filter.

Problem (18) can be expressed as the second-order cone programming (SOCP) problem by defining some new parameters $$\min_{h[n]}(t_1+\alpha t_2)$$

such that. $\|A_k x\|_2 \le t_1$ $\|Bx\|_2 \le t_2\|$ $Cx=d$ (19)

where $0 \le \omega_1 \le \omega_2 \le \ldots \le \omega_k \le \pi$, k=1, ..., M. A rule of thumb for choosing M, M≈15 N, is recommended:

$$x = [\ h[0]\quad h[1]\quad \ldots\quad h[N-1]\ ]^T$$

$$A_k = [\ e^{-j\omega_k 0}\quad e^{-j\omega_k 1}\quad \ldots\quad e^{-j\omega_k(N-1)}\ ]\ k \in I,\quad I = \{k|\omega_k \ge \omega_c\}$$

$$B = [\ 0\quad 1\quad 1\quad \ldots\quad 1\ ]_{1 \times N}$$

$$C = \begin{bmatrix} 0 & 1 & 2 & \ldots & N-1 \\ 1 & 1 & 1 & \ldots & 1 \end{bmatrix}_{2 \times N}$$

$$d = [\ 0\quad 1\ ]^T$$

Lemma: Like previously shown, a very special form of the semi-infinite constraints appears in filter design problems. General semi-infinite convex optimization is a well-developed field that allows them to be solved with no great theoretical or practical difficulty.

One starts by pointing out that the semi-infinite inequality constraint $g_i(x,\omega) \le 0$ for all $\omega \in [0,\pi]$ can be handled by expressing it as the ordinary inequality constraint $h_i(x) = \sup g_i(x,\omega) \le 0\ \omega \in [0,\pi]$.

It is easily verified that $h_i$ is a convex function of x, since for each $\omega$, $g_i(x, \omega)$ is convex in x. (On the other hand, $h_i$ is often nondifferentiable, even if the functions $g_i$ are differentiable.) Thus, the semi-infinite constraints in (19) can be handled by several methods for general (nondifferentiable) convex optimization, e.g., bundle methods, ellipsoid methods, or cutting plane methods. What is required in these methods is an efficient method for evaluating $h_i$ and a subgradient at any x. This involves computing a frequency $\upsilon$ for which $g_i(x, \upsilon) = h_i(x)$. In some problems this can be done analytically; in any case it can be found approximately by a (one-dimensional) search over frequency.

It is also possible to solve some magnitude filter design problems exactly, by transforming the semi-infinite constraints into (finite-dimensional) constraints that involve linear matrix inequalities, but this idea is not pursued here.

The semi-infinite constraints can also be approximated in a very straightforward way by sampling or discretizing frequency. A set of frequencies is chosen $0 \le \omega_1 \le \omega_2 \le \ldots \le \omega_M \le \pi$ often uniformly or logarithmically spaced, and replace the semi-infinite inequality constraint $g_i(x,\omega) \le 0$ For all $\omega \in [0,\pi]$ with the set of M ordinary inequality constraints $g_i(x,\omega) \le 0$ for all k=1, ..., M.

Note that sampling preserves convexity. When N is sufficiently large, discretization yields a good approximation of the semi-infinite programming (SIP). A standard rule of thumb is to choose M≈15 N.

There are still two more parameters that need to be designed in order to have a desired low pass FIR filter: 1) the length of the FIR filter (N), and 2) the cut off frequency ($\omega_c$).

Theorem 5: The length of an FIR filter is a quasi-convex function of its coefficients. Hence, the problem of finding the minimum-length FIR filter given the cut off frequency ($\omega_c$) may be stated as:
minimize N subject to $$\|A_k x\|_2 \le 0.7079 (-3\ dB) k \in I,\ I=\{k|\omega_k \ge \omega_c\}. \quad (20)$$

Equation (20) is quasi-convex and can be solved using bisection on N. Each iteration of the bisection involves solving an SOCP feasibility problem.

Lemma: By defining $f(a)=\min\{k|a_{k+1}= \ldots =a_N=0\}$, the sublevel sets of f are affine sets and convex: $\{a|f(a) \le k\}=\{a|a_{k+1}= \ldots =a_N=0\}$. This means f is a quasiconvex function, and the optimization problem is a quasiconvex optimization problem.

Figure 8:
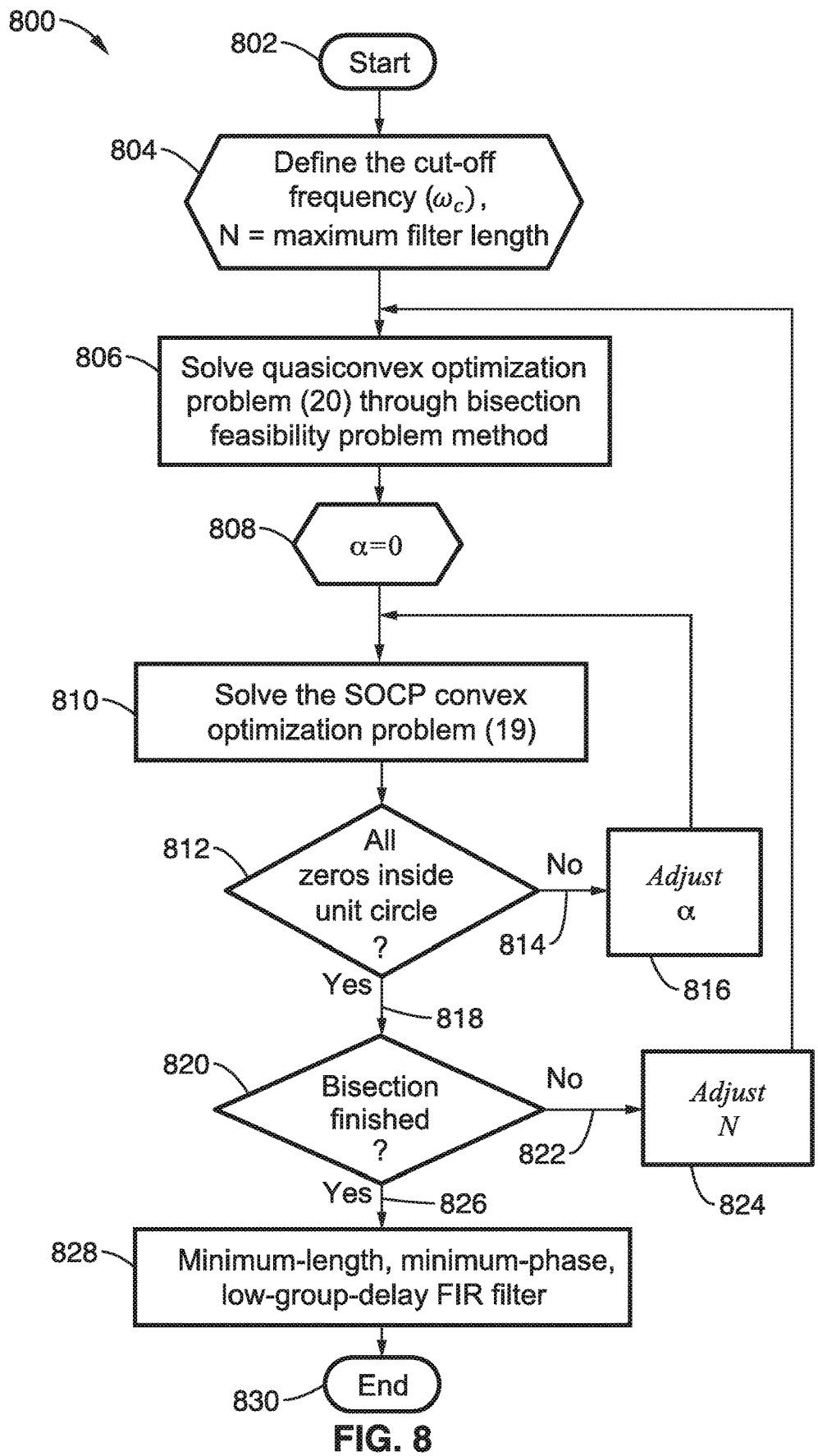
FIG. 8 is a flow chart of a procedure of designing the desired low-pass finite impulse response (FIR) filter with minimum-length, minimum-phase and minimum-group-delay (or low-group-delay) according to an embodiment of the presented technology.

Refer now to FIG. 8, which is a flow chart 800 of the procedure of designing the desired low-pass FIR filter with minimum-length, minimum-phase and low-group-delay. Here, the procedure starts 802 with a definition of the cut-off frequency ($\omega_c$) 804, and the maximum possible filter length $N_{max}$. With the cut-off frequency 804 and the maximum possible filter length defined, Equation (20) is solved 806 as a quasiconvex optimization problem through the bisection feasibility problem method. Next, variable a is set 808 to 0. The SOCP convex optimization problem of Equation (19) is next solved 810. The solution of the preceding optimization problem is then checked 812 to see if all zeros are within the unit circle. If not 814, then a is adjusted 816, and execution continues back with the SOCP convex optimization problem of Equation (19) of 810.

Eventually, all zeros will fall within the unit circle at the 812 test, and the bisection criterion is tested 820. Here, if the bisection has not reached the end 822, then N is adjusted 824, and execution continues with the Equation (20) solution 806. The adjustment 824 of N is accomplished by setting N=(l+u)/2 where l and u are the respective lower and upper limits of bisection and updated in a loop, as shown more completely in Table 1.

If the bisection procedure 820 reaches the end 826, then the minimum-length, minimum-phase, low-group-delay FIR filter 828 is executed, and execution terminates 830.

More succinctly, the algorithm of FIG. 8 is shown in Table 1.

1.4 Prediction

In order to compensate the existing delay in the devices and control system and increase the performance of the real time control, knowing the next state of the system would be helpful. This section proposes a new hybrid method for super short-term solar power prediction. Solar output power usually has a complex, nonstationary, and nonlinear characteristic due to intermittent and time varying behavior of solar radiance.

In addition, solar power dynamics is fast and is inertialess. An accurate super short-time prediction is required to compensate for the solar radiance fluctuations and reduce the delay impact of devices on solar power smoothing. The objective is to predict one step-ahead solar power generation based only on historical solar power time series data.

The method of this disclosure incorporates discrete wavelet transform (DWT), Auto-Regressive Moving Average (ARMA) models, and Recurrent Neural Networks (RNN). The RNN architecture is based on Nonlinear Auto-Regressive models with eXogenous inputs (NARX). The wavelet transform is utilized to decompose the solar power time series into a set of richer-behaved forming series for prediction. The ARMA model is employed as a linear predictor while NARX is used as a nonlinear pattern recognition tool to estimate and compensate the error of wavelet-ARMA prediction. The method described here was applied to the data captured from the test solar PV panels.

In the approach here, an RNN is integrated with an ARMA model and the wavelet method is employed to decompose the input data to a series with better features for prediction. In one embodiment, the hybrid method of this disclosure includes the following prediction stages:

Stage 1) Decomposition of historical power series into the constitutive series through the wavelet transforms.

Stage 2) Modeling each of the constitutive series by ARMA model for recognition of their linear pattern.

Stage 3) Recomposition of estimated series obtained from ARMA model for each constitutive series through the inverse wavelet transform.

Stage 4) Compensating the error of the wavelet-ARMA model prediction by recurrent neural networks through capturing the nonlinear patterns buried in the residual part.

With the aim of improving the prediction accuracy an embodiment of the method considers the time series as the composition of a linear stationary and autocorrelation component ($S_L$), and a nonlinear structure ($S_N$):

$$S(t)=S_L(t)+S_N(t). \quad (21)$$

Thus the linear ($S_L$) and nonlinear ($S_N$) components have to be predicted according to the current and past data separately. The idea is that the decomposed time series by wavelet is first modeled through ARMA. That is the wavelet-ARMA method is used to model the linear component of the time-series. Then, referring to (21), the residual of the wavelet-ARMA model (the linear model) contains only the nonlinear part of time series.

This means that after estimation of the predicted value of linear component from time series ($\hat{S}_L$), the error of prediction (e(t)) is calculated from (22).

$$e(t)=S(t)-\hat{S}_L(t). \quad (22)$$

The next step is the residual analysis for mining nonlinear patterns in the error. Extracting any meaningful nonlinear pattern in the error compensates for the wavelet-ARMA limitation and leads to improvement of the prediction algorithm. In this work the NARX is preferred to capture the nonlinearity in the error. Therefore the NARX model of error at each time can be expressed by a nonlinear function of past errors as a feedback target and power times series changes as non-feedback inputs.

$$e(t)=f(S(t-n_u), \ldots ,S(t-1),S(t),e(t-n_y), \ldots ,e(t-1))+\epsilon(t) \quad (23)$$

where function f(.) is a nonlinear function defined by NARX and E(t) is the random remaining error, S(t) is solar power time series and e(t) is wavelet-ARMA error.

In fact the f(.) function is modeling a prediction of the nonlinear component of time series ($\hat{S}_N$). Therefore, the method of this disclosure is benefiting from the privilege of wavelet-ARMA model for extracting linear feature of data, and it is taking advantage from NARX model for exploring nonlinear characteristic of the error.

Figure 9:
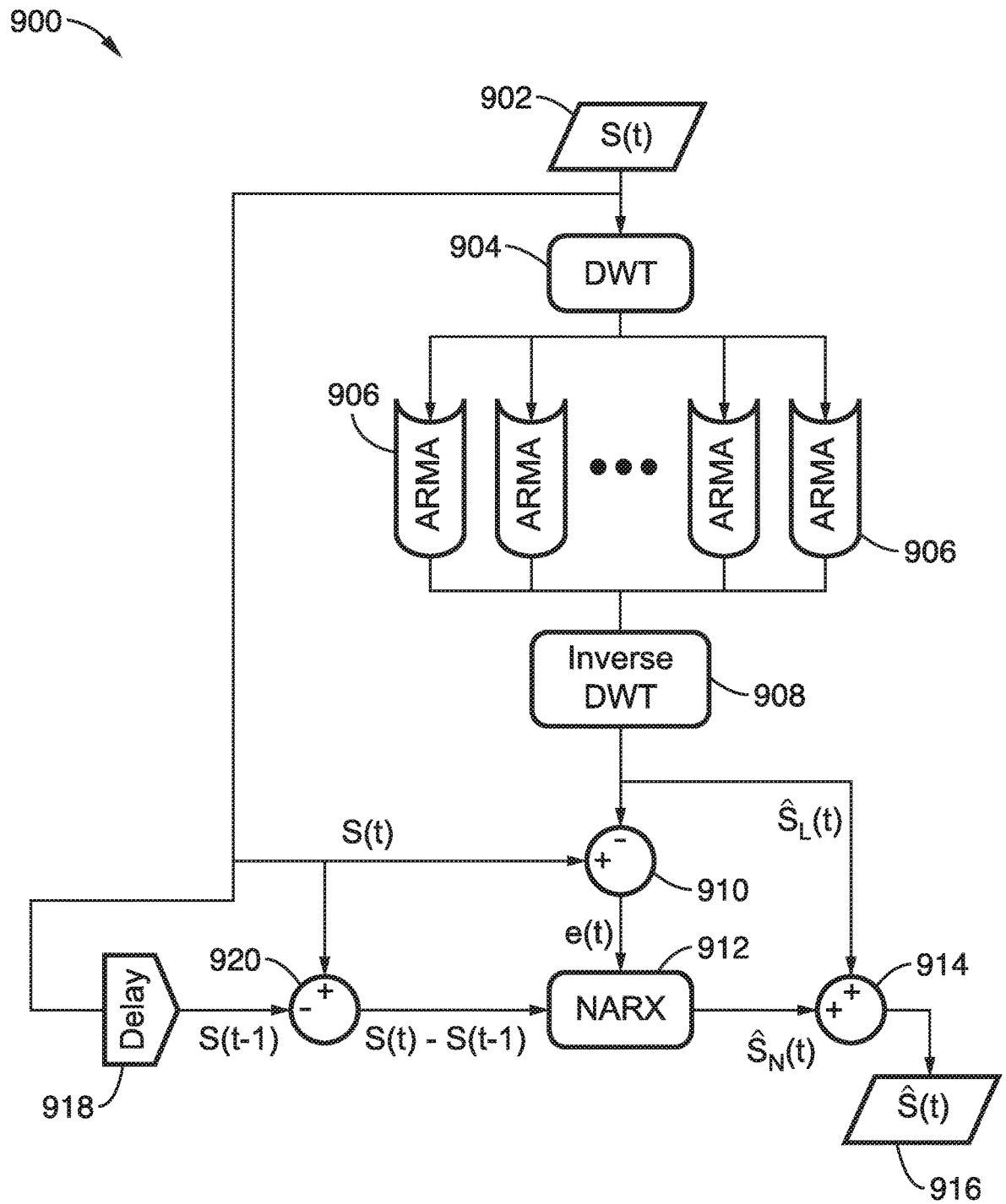
FIG. 9 is a flow chart of a procedure implementing the hybrid optimization algorithm according to an embodiment of the presented technology.

Refer now to FIG. 9, which is a flowchart 900 of an embodiment of the above optimization algorithm. Here, S(t) is input 902 into a discrete wavelet transform (DWT) 904, which then outputs to a multitude of Auto-Regressive Moving Average (ARMA) models 906. These ARMA models 906 are then used as input to an inverse discrete wavelet transform (Inverse DWT) 908.

The output from the Inverse DWT 908 is the linear time series $\hat{S}_L(t)$, which is subtracted 910 from the initial S(t) input 902 to form the prediction error e(t), which is then input into the Nonlinear Auto-Regressive model with eXogenous inputs (NARX) 912. The NARX 912 outputs the nonlinear $\hat{S}_N(t)$ time series term, which is added 914 to produce the time series output $\hat{S}(t)=\hat{S}_L(t)+\hat{S}_N(t)$ at 916.

Additionally, input 902 time S(t) is delayed 918 to form Set S(t−1), and subtracted from (t) to form the input of the NARX model, that is subsequently used along with the error prediction e(t) to find $\hat{S}_N(t)$.

Example 2

Figure 10:
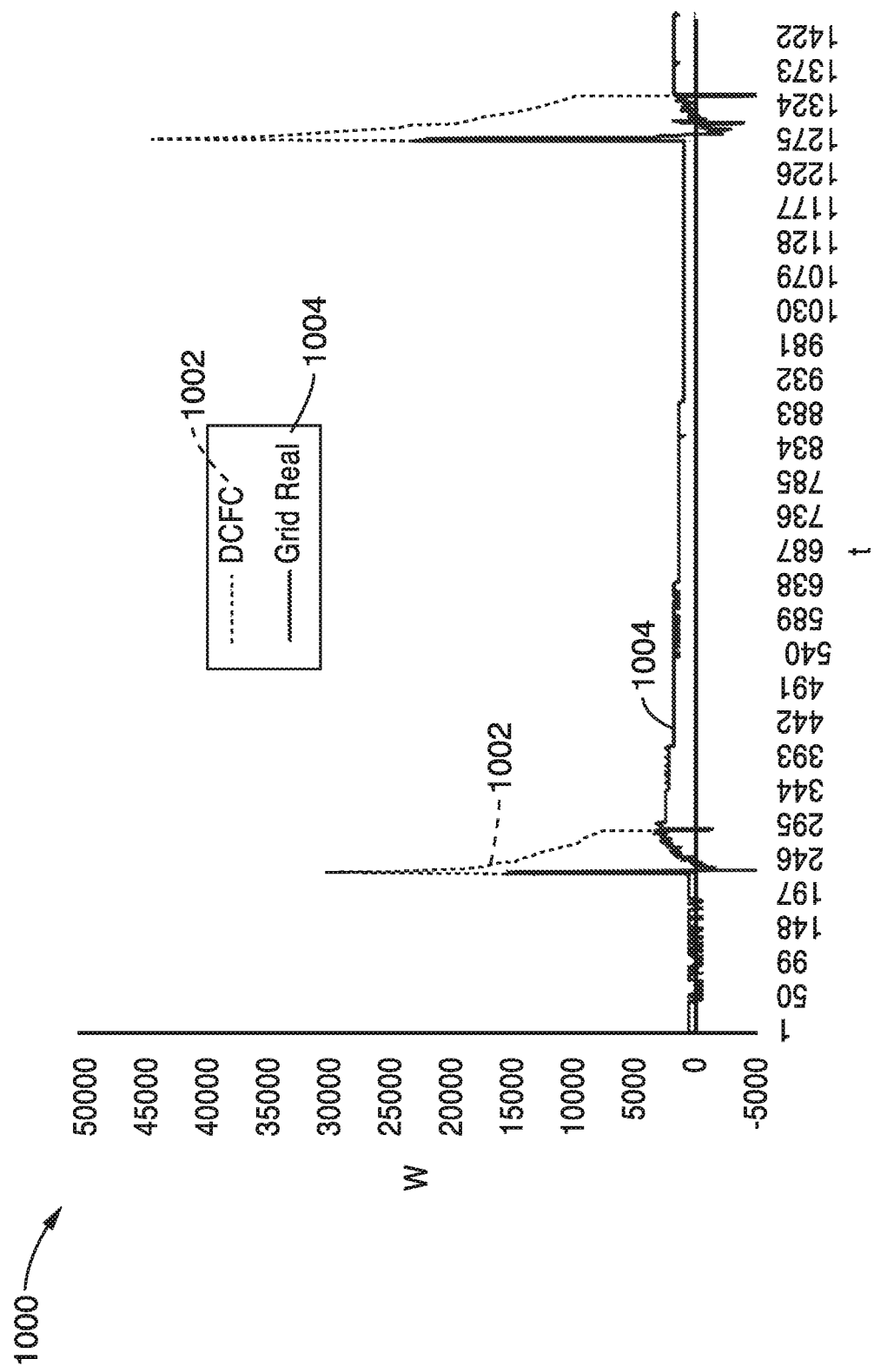
FIG. 10 is a graph of Direct Current Fast Charging (DCFC) and real power seen by the grid versus time.

Refer now to FIG. 10, which is a graph 1000 of DC Fast Charging (DCFC) 1002 and power seen by the grid 1004 versus time. This would be roughly the system previously described in FIG. 3C. This second example application is power demand shifting, which is used to cut the peak demand of a level 3 DCFC charging station: one of the high demanding loads on the grid. The same technology developed in the last section is applied to this new application. FIG. 10 shows the result of this application under test.

Figure 11:
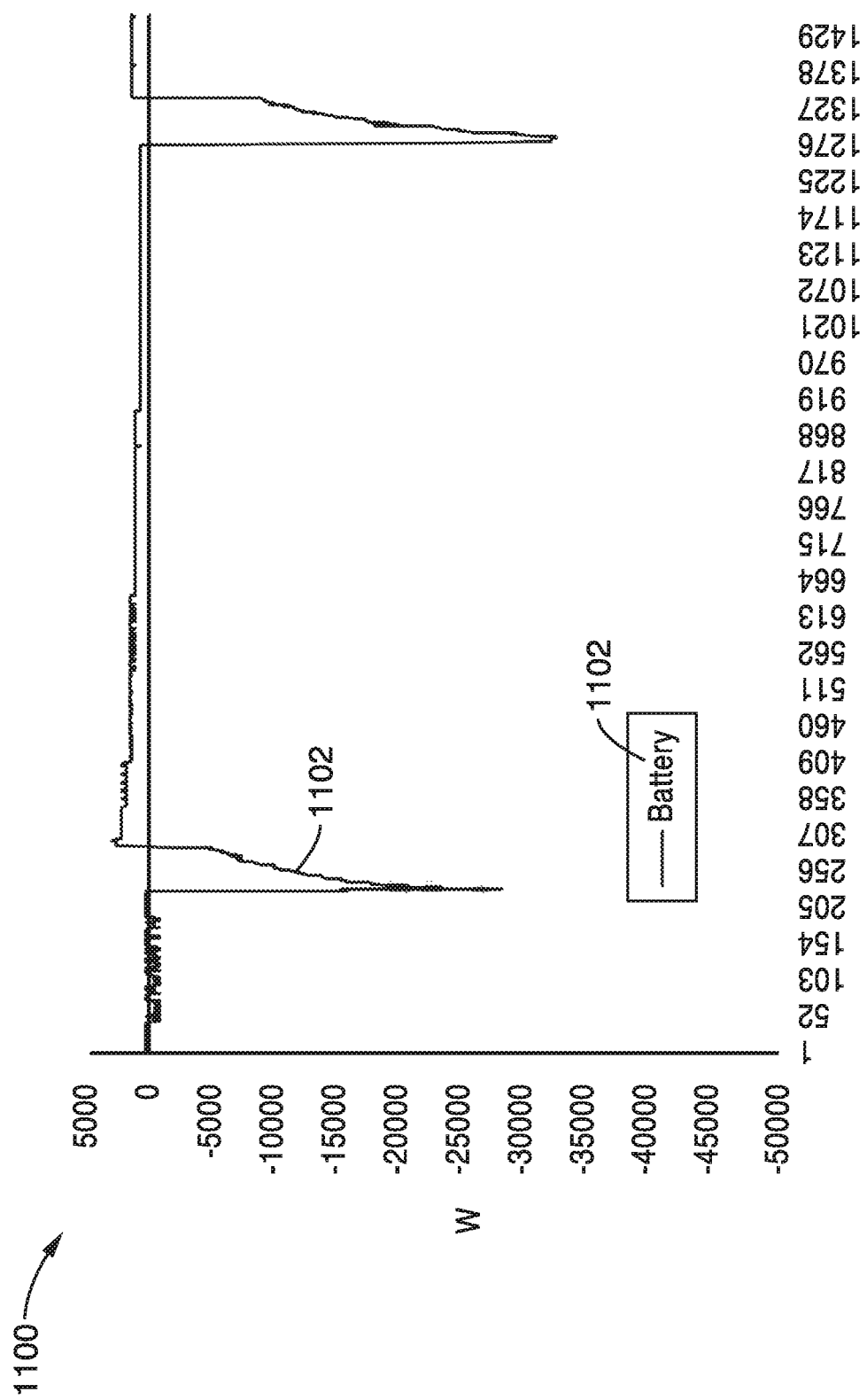
FIG. 11 is a graph of battery power output versus time for the DCFC load test by BESS according to an embodiment of the presented technology.

Refer now to FIG. 11, which is a graph 1100 of battery power output 1102 versus time for the DCFC load test. During the test, the battery discharges for a short period to cut and compensate the level 3 charger station power demand and afterward continues charging. The battery power output 1102 curve shows the reaction of the battery.

Due to limitation of battery energy storage system (BESS) power capacity (36 kw) compared with the load (50 kw) the BESS is not able to compensate for the maximum power usage completely. However, it can be seen that the battery energy storage system can cut the demand significantly.

Example 3

A third example application is controlling the active and reactive power for voltage regulation purpose in distribution system.

The intermittent nature of modern power generation and loads, for example renewable energy sources and EV loads, impacts the load profile of the low voltage distribution feeder. The wide penetration of these new loads and generation sources may cause challenges to grid distribution.

One of these challenges is overloading of transformers and high voltage drops at the end of a feeder, or over-generation and voltage increase at the point of the renewables connection.

When overloading occurs, transformers and power cables will need to be replaced. However, such equipment is extremely costly, and it is often a difficult task to replace them. On the other hand, the over-generation problem normally is solved by curtailment renewable energy generation, which essentially wastes free energy.

One practical and effective solution to achieve flexible power control and solve voltage fluctuation issues is the deployment of battery energy storage systems (BESS). Battery energy storage systems (BESS) can be helpful for voltage regulation by: 1) shifting the peak load and avoid overloading, 2) restoring the extra generation, and 3) controlling the active and reactive power to thereby improve the output voltage profile.

In both the distribution side and Low Voltage (LV) feeders, impedance is mostly resistive and the R/X ratio is considerable, as opposed to medium voltage feeder and transmission lines. Thus, the role of active power can be as important as reactive power for control of voltage variations and losses in a radial LV distribution feeder. This fact encourages the investigation and solution of the voltage regulation problem by employing both active and reactive power. Such an approach allows for finding a tradeoff between these two parameters to optimally regulate output grid voltage.

In this section, the application of a battery energy storage system (BESS) that uses both a battery and GTI is studied. Here, the BESS allows for real-time voltage regulation through active and reactive power control. In one experiment the battery energy storage system (BESS) is integrated by a grid tie inverter (GTI) to the distribution grid at the University of California Los Angeles (UCLA) Engineering IV building.

The method used here periodically measures grid voltage (every second) and outputs the measurement to the local controller of a battery energy storage system (BESS). A proportional integral (PI) controller acts as the local controller, which is designed to control active and reactive power, along with the mode of inverter operation (charging, discharging, leading or lagging) in order to regulate the grid voltage based on a desired grid voltage set point.

Figure 12:
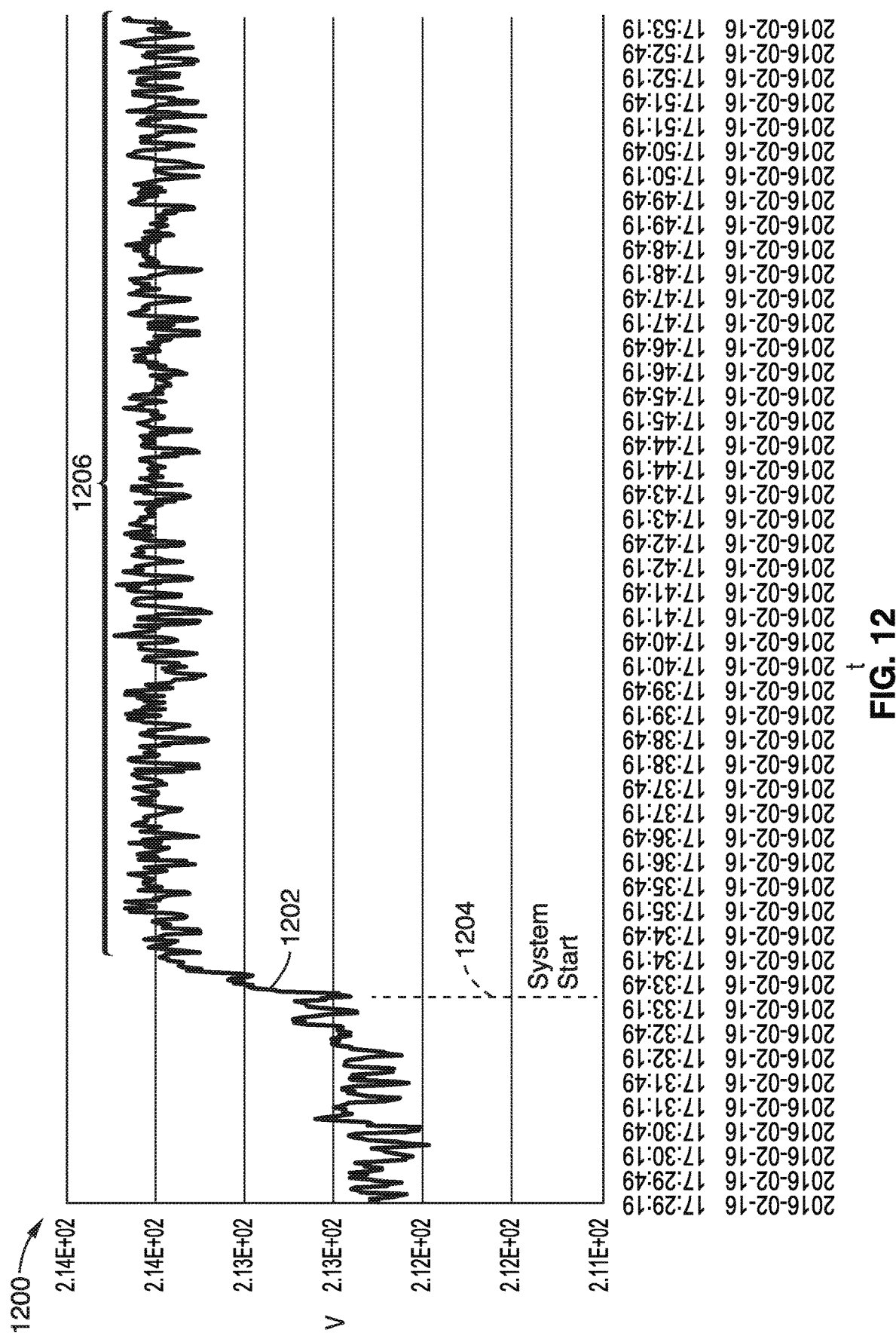
FIG. 12 is a graph of the grid voltage versus time according to an embodiment of the presented technology.

Refer now to FIG. 12, which is a graph 1200 of the grid voltage 1202 versus time. According to the FIG. 12, at the beginning when the controller is not activated the voltage is around 212 VAC. At t=17:33:45 the controller is activated 1204 while the desired grid voltage reference is set to 214 VAC. It can be seen after a while the grid voltage increases to the desired reference voltage 1206.

Figure 13:
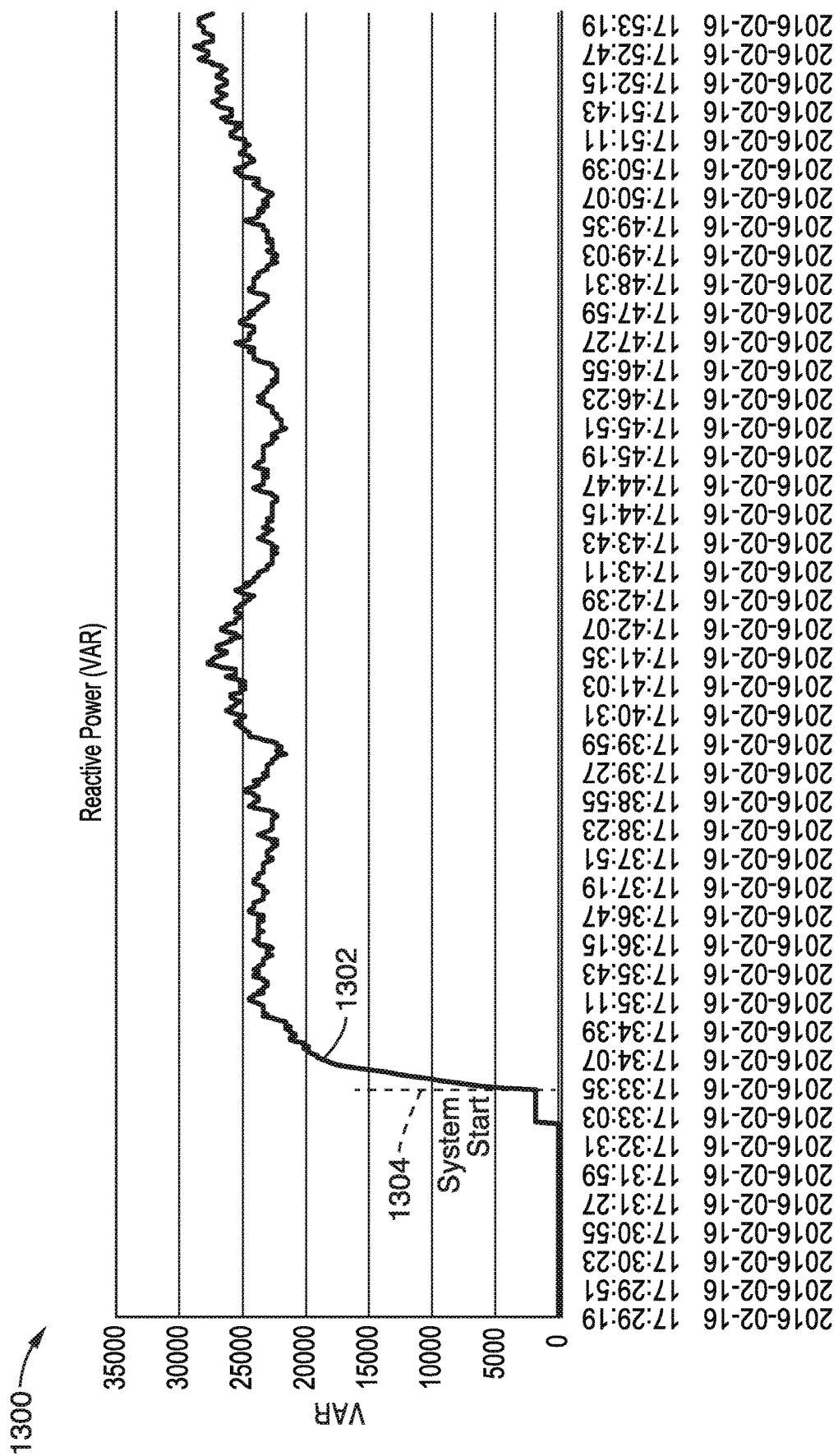
FIG. 13 is a graph of the reactive power versus time of the active and reactive power controlled by the GTI according to an embodiment of the presented technology, during the same time frame as that of FIG. 12.
Figure 14:
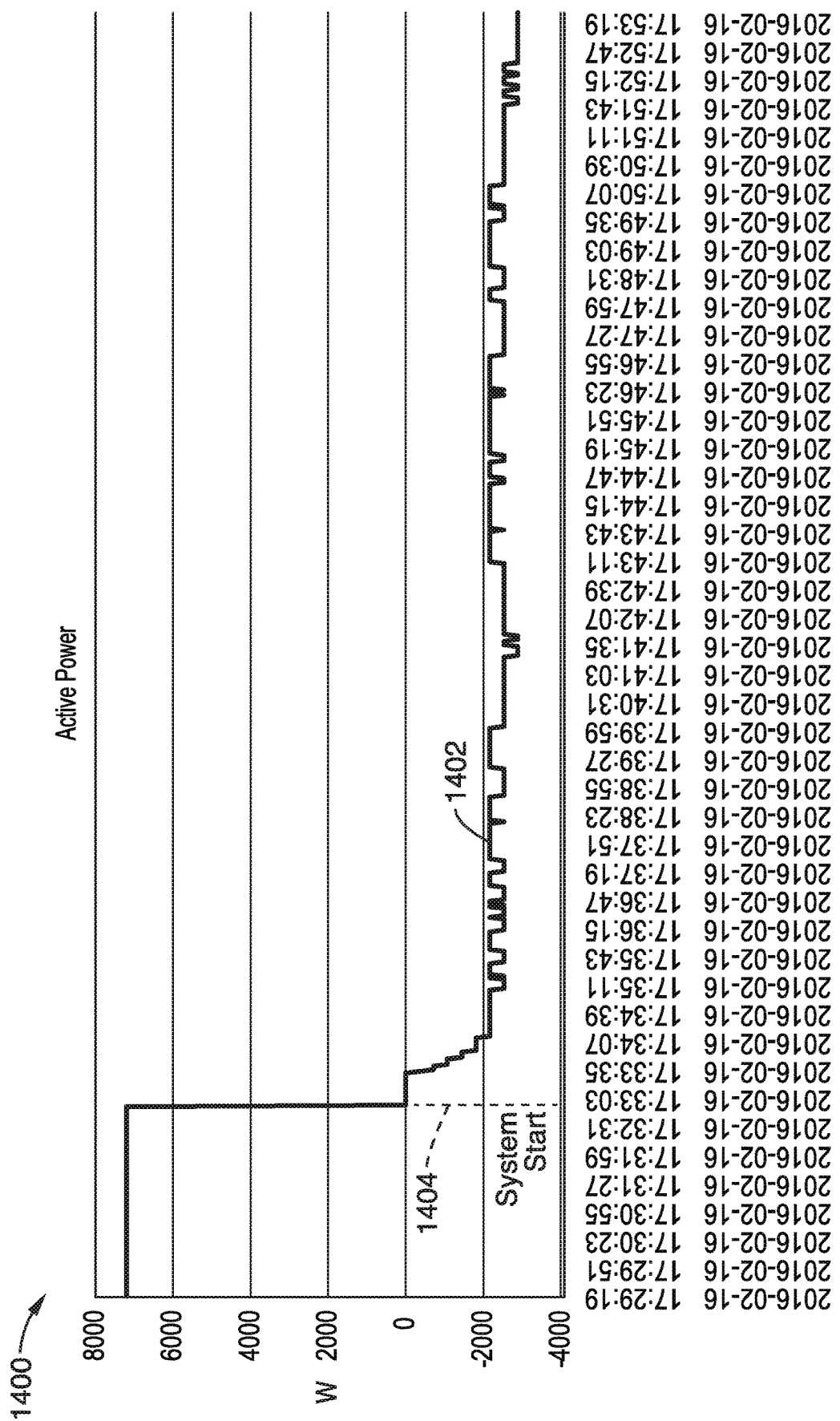
FIG. 14 is a graph of the power versus time of the active and reactive power controlled by the GTI according to an embodiment of the presented technology, during the same time frame as that of FIG. 12 and FIG. 13.

Refer now to FIG. 13 and FIG. 14, which are graphs taken during the same time period as previously shown in FIG. 12. FIG. 13 is a graph 1300 of the reactive power 1302 versus time of the active and reactive power controlled by the GTI. During the same timeframe, FIG. 14 is a graph 1400 of the active power 1402 versus time of the active and reactive power controlled by the GTI.

It can be seen that in order to increase the grid voltage, the reactive power injected to the system (leading mode) and the battery energy storage system switches from the normal charging mode operation to discharging mode, and injects the active power into the grid in order to compensate for grid loads.

Example 4

Tables 2-8 provide examples of central controller and local controller software for implementing the internet distributed system.

CONCLUSION

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that that the present disclosure encompasses multiple embodiments which include, but are not limited to, the following:

1. A battery energy storage and delivery control system, the system comprising: (a) a central controller computer; (b) said central computer including a non-transitory memory storing instructions executable by a hardware processor associated with the central controller computer; (c) a local controller computer; (d) said local controller computer including a non-transitory memory storing instructions executable by a hardware processor associated with the local controller computer; (e) said central controller computer and said local controller computer each having a communications interface configured for network communications; (f) a grid tie inverter having a communications interface configured for network communications with the local controller computer; (g) the grid tie inverter having a port for connection to an electrical grid and a port for connection to a battery; (h) a set of instructions stored on the local controller computer memory and executable by the local controller computer, said instructions comprising an operation control module configured for operation of the system in real time, wherein the system provides grid support by leveling load on the grid, regulating grid voltage, improving power quality of the grid, improving angular (transient) stability of the grid, compensating for unbalanced loads on the grid, and providing spinning reserves; (i) a set of instructions stored on the central controller computer memory and executable by the central controller computer, said instructions comprising: (1) a communications control module configured to control communication of the central control computer with other system component; (2) a safety features module configured to monitor and control criteria for safe operation of the battery and load powered by the battery, said criteria selected from the group consisting of battery over-temperature, overcurrent of battery charging and discharging, battery undervoltage, battery overvoltage, battery ventilation, battery cell imbalance, degradation of battery state of health, battery short circuit, and ground fault.

2. The system of any preceding embodiment, further comprising a load tie inverter having a port for connection to the battery, a port for connection to a load, and a communications interface configured for communications with the local controller computer.

3. The system of any preceding embodiment, further comprising a second grid tie inverter, the second grid tie inverter comprising a port for connection to the electrical grid, a port for connection to a source of solar generated electrical power, and a communications interface configured for communications with the local controller computer.

4. The system of any preceding embodiment, wherein said set of instructions for said central controller computer, said set of instructions for said local controller computer, or both, are configured to manage operational modes selected from the group consisting of a battery charging mode, a battery discharging mode, a leading mode, and a lagging mode.

5. A battery energy storage system (BESS), the system comprising: (a) a central controller computer; (b) a non-transitory memory storing instructions executable by the central computer; (c) a local controller computer; (d) a non-transitory memory storing instructions executable by the local computer; (e) wherein said central controller instructions and said local controller instructions, when respectively executed by the central controller computer and the local controller computer allow for a communications interface configured for network communications therebetween; (f) a control system computer comprising the local controller computer and the central controller computer; (g) a grid tie inverter, comprising: (1) a port for connection to an electrical grid; (2) a port for connection to a battery; and (3) a communications interface configured for communications with the control system; and (h) wherein said central controller and said local controller instructions, when executed among the local controller computer and the central controller memory, form a set of operational instructions performing steps comprising: (1) controlling communication between the central controller computer and the local controller computer; (2) executing a safety features control section; and (3) executing an operation control and monitoring section.

6. The system of any preceding embodiment, wherein the control system computer is configured to monitor and control criteria for the safe operation of the battery.

7. The system of any preceding embodiment, wherein the monitor and control criteria for the safe operation of the battery are selected from the group of criteria consisting of: (a) detecting battery over-temperature; (b) detecting battery overcurrent charging; (c) detecting battery overcurrent discharging; (d) detecting battery undervoltage; (e) detecting battery overvoltage; (f) detecting battery ventilation control; (g) detecting battery ventilation fault; (h) detecting battery cell imbalance; (i) detecting degraded battery state of health; (j) detecting battery short circuit; (k) detecting arc fault; and (l) detecting ground fault.

8. The system of any preceding embodiment, wherein the control system computer is configured to monitor and control criteria for the safe operation of the grid.

9. The system of any preceding embodiment, wherein the monitor and control criteria for the safe operation of the grid are selected from the group of criteria consisting of: (a) monitoring and controlling of the BESS in real time; (b) providing grid support by leveling loads on the electrical grid; (c) regulating electrical grid voltage; (d) improving power quality of the electrical grid; (e) improving transient and phase stability of the electrical grid; (f) compensating for unbalanced loads on the electrical grid; and (g) providing spinning reserves for the grid.

10. The system of any preceding embodiment, comprising: a second grid tie inverter, the second grid tie inverter comprising: (1) a second port for connection to an electrical grid; (2) a second port for connection to a battery; and (3) a second communications interface configured for communications with the control system.

11. The system of any preceding embodiment, wherein said set of operational instructions are configured to manage system operational modes selected from the group consisting of: a battery charging mode, a battery discharging mode, a current leading mode, and a current lagging mode.

12. The system of any preceding embodiment, comprising: a second grid tie inverter, the second grid tie inverter comprising: (1) a second port for connection to an electrical grid; (2) a second port for connection to a high current direct current (HCDC) charging station for an electric vehicle; and (3) a second communications interface configured for communications with the control system.

13. The system of any preceding embodiment, comprising: a second grid tie inverter, the second grid tie inverter comprising: (1) a second port for connection to an electrical grid; (2) a second port for connection to a photovoltaic system; and (3) a second communications interface configured for communications with the control system.

14. The system of any preceding embodiment, wherein the set of operational instructions further performs steps comprising: (a) collecting an historical power series; (b) decompositing the historical power series into a constitutive series through wavelet transformations; (c) modeling each of the constitutive series by a plurality of Auto-Regressive Moving Average (ARMA) models for recognition of their linear patterns, whereby a plurality of ARMA models are produced; (d) recompositing an estimated series obtained from the plurality of ARMA models for each constitutive series through an inverse wavelet transform; and (e) compensating for an error of the wavelet transformation and ARMA model predictions by recurrent neural networks through capturing of nonlinear patterns buried in a difference between the historical power series and the estimated series, whereby a time series estimate is produced.

15. A non-transitory medium storing instructions executable by a computer processor, said instructions when executed by the computer processor performing steps comprising: (a) collecting an historical power series; (b) decompositing the historical power series into a constitutive series through wavelet transformations; (c) modeling each of the constitutive series by a plurality of Auto-Regressive Moving Average (ARMA) models for recognition of their linear patterns, whereby a plurality of ARMA models are produced; (d) recompositing an estimated series obtained from the plurality of ARMA models for each constitutive series through an inverse wavelet transform; (e) compensating for an error of the wavelet transformation and ARMA model predictions by recurrent neural networks through capturing of nonlinear patterns buried in a difference between the historical power series and the estimated series, whereby a time series estimate is produced.

16. A method for performing a hybrid optimization, the method comprising: (a) collecting an historical power series; (b) decompositing the historical power series into a constitutive series through wavelet transformations; (c) modeling each of the constitutive series by a plurality of Auto-Regressive Moving Average (ARMA) models for recognition of their linear patterns, whereby a plurality of ARMA models are produced; (d) recompositing an estimated series obtained from the plurality of ARMA models for each constitutive series through an inverse wavelet transform; and (e) compensating for an error of the wavelet transformation and ARMA model predictions by recurrent neural networks through capturing of nonlinear patterns buried in a difference between the historical power series and the estimated series; (f) wherein said method is performed by a computer processor executing instructions stored on a non-transitory computer-readable medium.

17. A non-transitory medium storing instructions executable by a computer processor, said instructions when executed by the computer processor performing steps comprising: (a) designing a low-pass finite impulse response (FIR) filter with minimum-length, minimum-phase, and low-group-delay; (b) initializing a cut-off frequency $\omega_c$ a maximum possible filter length $N_{max}$, and an error bound $\epsilon$; (c) solving the problem:
minimize N subject to
$\|A_k x\|_2 \leq 0.7079(-3 \text{ dB})$ k$\in$I, I=$\{k|\omega_k \geq \omega_c\}$ as a quasiconvex optimization problem by using a bisection feasibility problem method; (d) solving a second-order cone programming (SOCP) problem by defining parameters $$\min_{h[n]}(t_1+\alpha t_2)$$

such that. $\|A_k x\|_2 \leq t_2\|$ $\|Bx\|_2 \leq t_2\|$ $Cx=d$ where $0 \leq \omega_1 \leq \omega_2 \leq \ldots \leq \omega_k \leq \pi$, k=1, M; (1) by initially setting $\alpha=0$; (2) solving the SOCP problem; (3) incrementing $\alpha$ by 1 until all zeroes are inside the unit circle; (4) determining if the group delay (grd) of $$\max(grd) = \frac{r}{1+r}$$

is feasible; (i) if feasible, then setting u=t; (ii) if not feasible, then setting l=t; and (5) repeating until u−l≤$\epsilon$.

18. A method for designing a low-pass finite impulse response (FIR) filter with minimum-length, minimum-phase, and low-group-delay, the method comprising: (a) initializing a cut-off frequency $\omega_c$, a maximum possible filter length $N_{max}$, and an error bound $\epsilon$; (b) solving the problem:
minimize N subject to $\|A_k x\|_2 \leq 0.7079(-3 \text{ dB})k\in I$, $I=\{k|\omega_k \otimes \omega_c\}$ as a quasiconvex optimization problem by using a bisection feasibility problem method; (c) solving a second-order cone programming (SOCP) problem by defining parameters $$\min_{h[n]}(t_1+\omega t_2)$$

such that. $\|A_k x\|_2 \leq t_1$ $\|Bx\|_2 \leq t_2\|$ $Cx=d$ where $0 \leq \omega_1 \leq \omega_2 \leq \ldots \leq \omega_k \leq \pi$, k=1, . . . , M; (1) by initially setting $\alpha=0$; (2) solving the SOCP problem; (3) incrementing a by 1 until all zeroes are inside the unit circle; (4) determining if the group delay (grd) of $$\max(grd) = \frac{r}{1+r}$$

is feasible; (i) if feasible, then setting u=t; (ii) if not feasible, then setting l=t; and (5) repeating until u−l≤$\epsilon$; (d) wherein said method is performed by a computer processor executing instructions stored on a non-transitory computer-readable medium.

19. A battery energy storage system (BESS), comprising: (a) a control system computer; (b) a non-transitory memory storing instructions executable by the control system computer; (c) a grid tie inverter, comprising: (1) a port for connection to an electrical grid; (2) a port for connection to a battery; and (3) a communications interface configured for communications with the control system; and (d) wherein said instructions executable by the control system computer perform steps comprising: (1) executing a safety features control section; and (2) executing an operation control and monitoring section.

20. The system of any preceding embodiment, wherein the control system computer comprises: (a) a local controller computer; and (b) a central controller computer.

21. The system of any preceding embodiment, wherein said instructions executable by the control system computer perform steps comprising: controlling communication between the central controller computer and the local controller computer.

22. The system of any preceding embodiment, wherein the control system computer is configured to monitor and control criteria for the safe operation of the battery.

23. The system of any preceding embodiment, wherein the monitor and control criteria for the safe operation of the battery are selected from the group of criteria consisting of: (a) detecting battery over-temperature; (b) detecting battery overcurrent charging; (c) detecting battery overcurrent discharging; (d) detecting battery undervoltage; (e) detecting battery overvoltage; (f) detecting battery ventilation control; (g) detecting battery ventilation fault; (h) detecting battery cell imbalance; (i) detecting degraded battery state of health; and (j) detecting battery short circuit; (k) detecting arc fault; and (l) detecting ground fault.

24. The system of any preceding embodiment, wherein the control system computer is configured to monitor and control criteria for the safe operation of the grid.

25. The system of any preceding embodiment, wherein the monitor and control criteria for the safe operation of the grid are selected from the group of criteria consisting of: (a) monitoring and controlling of the BESS in real time; (b) providing grid support by leveling loads on the electrical grid; (c) regulating electrical grid voltage; (d) improving power quality of the electrical grid; (e) improving transient and phase stability of the electrical grid; (f) compensating for unbalanced loads on the electrical grid; and (g) providing spinning reserves for the grid.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

All cited references are incorporated herein by reference in their entirety.

Table 1

Input:

Cut-off frequency $\omega_c$,

Maximum filter length $N_{max}$

Algorithm:

Given $l \leq N^*$, $u \geq N^*$, tolerance $\varepsilon > 0$. (Here $\varepsilon = 1$, $l = 1$, $u = N_{max}$)

Repeat 1. $N = (l+u)/2$.

2. Solve the convex problem (19).
       2.1 initiate α =0
       2.2 repeat solve (19)
       2.3 adjust α
       Until all zeroes are inside the unit circle 3. If (17) is feasible, $u = t$; else $l = t$.
       Until $u - l \leq \epsilon$.

Table 2

Second Layer (Central Controller Side) - File 1

This code develops the optimized FIR filter to generate the real-time reference for battery energy storage system in solar power smoothing

```
double_optmized_filter_PT clear all
close all
clc
load Power3
load Minimum-phase-filter-PT_match_mag
tic
sample=0.5;
res=8;
P=PT;
Cap=zeros(1,length(P));
max_order =length(P);
n_bot = 1;
n_top = max_order;
n_best = Inf;
filter_error_old=inf;
Fs=2/60;
BW = 0.006*pi;
w_tar=0;
while( n_top - n_bot > 1)

n = ceil( (n_top + n_bot)/2 );%round(Numberofpoints*1.4);
    Numberofpoints =n;%round(size(P,1)/res);
    nn=[0:n-1];
```

```
N=15*n;
w = linspace(w_tar, pi, N)';
A = exp(-1i*w*nn);
ind = find((0 <= w) & (w < BW));   % passband
Ap  = A(ind,:);
% transition band is not constrained (w_pass <= w <= w_stop)
W_best=zeros(N,1);
W_best(ind)=1;
% stopband (w_stop <= w)
ind = find((BW <= w) & (w <= pi));  % stopband
As  = A(ind,:);
Atar = exp(-1i*w_tar*nn );
Abw = exp(-1i*BW*nn );

lamda=0;
r=ones(1,n);
EE=0;
EEE=0;
cvx_quiet(true)
while sum(r<1)<n-1
  lamda=lamda+10*EE+5*EEE;
cvx_begin
  variable a(n)
  minimize(norm(As*a,2)+lamda*norm(a(2:n),2))
  %minimize(max(abs(As*a))+lamda*norm(a(2:n),2))
  subject to
    Atar*a == 1;
    nn*a == 0;
    %nn.^2*a==0;
cvx_end
r=abs(roots(a))';
EE=1-(sum(r<1)/length(r));
```

```
 EEE=EEE+EE;
 (sum(r<1)/length(r))*100;
 end if (abs(As*a)<=0.7079),
    fprintf( 1, 'The optimum n is less than n=%d.\n', n );
    n_top = n;
    filter_error_old=filter_error;
 else
    n_bot = n;
    filter_error_old=filter_error;
    fprintf( 1, 'The optimum n is more than n=%d.\n', n );
 end
end
toc
save('FIR_filter_optimized.mat', 'a')

figure(2)
plot(time1,P/1000,time1,avgP/1000,time1,abs(avgP1)/1000,time1,avgP3/100)
legend('Solar','Remez Filter Output','Proposed Optimized Filter Output','Moving Average Filter Output','location','best');

hfvt = fvtool(a,'Fs', Fs,...
        'Analysis', 'polezero',...
        'legend','on');
legend(hfvt, 'Optimized');
hfvt = fvtool(coeff,'Fs', Fs,...
        'Analysis', 'polezero',...
```

```
          'legend','on');
legend(hfvt, 'Average');
hfvt = fvtool(Hmin,'Fs', Fs,...
       'Analysis', 'polezero',...
          'legend','on');
legend(hfvt, 'Minimum Phase');

%%%%%%%%% Old filter (Minimum-phase-filter-
PT)%%%%%%%%%%%%%%%%%%%

%clc display('************** Minimum-phase-filter ****************')

sub1=P-avgP;
error1=sum(sub1)/sum(P)
sub1p=sub1;
sub1n=sub1;
for k=1:size(sub1,1)
   if sub1(k,1)<0
      sub1p(k,1)=0;
   elseif sub1(k,1)>0
      sub1n(k,1)=0;
   end
end
   for j=1:length(sub1)
    Cap(j)=sum(sub1(1:j));
   end
``` battery_cap=max(abs(Cap))*sample/60*1.2 inveterratec=max(sub1p)*1.2 inveterrated=max(abs(sub1n))*1.2 inveter_rate=max(inveterratec,inveterrated)

P_last=P(1:length(P)-1);

P_2last=P_last(1:length(P_last)-1);

fluctuaction=norm(P(2:end)-P_last,1)+norm(2*P_last(2:end)+P_2last+P(3:end),2);

smoothess=1/fluctuaction;

avgP_last=avgP(1:length(avgP)-1);

avgP_2last=avgP_last(1:length(avgP_last)-1);

fluctuaction1=norm(avgP(2:end)-avgP_last,1)+norm(2*avgP_last(2:end)+avgP_2last+avgP(3:end),2);

smoothness1=1/fluctuaction1;

Improvement_factor=smoothness1/smoothness

%%%%%%%%%%%%%%%%%%%%%%%%%%%%%%%%%%%%%%%%%%%%%%%%%%%%%%%%%%%%%%%%%%%%%% display('**************New Filtering****************')

sub1_f=P-avgP1;

error1_f=sum(sub1_f)/sum(P)

sub1p_f=sub1_f;

sub1n_f=sub1_f;

for k=1:size(sub1_f,1)

```
    if sub1_f(k,1)<0
       sub1p_f(k,1)=0;
    elseif sub1_f(k,1)>0
       sub1n_f(k,1)=0;
    end
end
    for j=1:length(sub1_f)
      Cap_f(j)=sum(sub1_f(1:j));
    end
``` battery_cap_f=max(abs(Cap_f))*sample/60*1.2 inveterratec_f=max(sub1p_f)*1.2 inveterrated_f=max(abs(sub1n_f))*1.2 inveter_rate_f=max(inveterratec_f,inveterrated_f)

save('Optimized-filter_PT','a')

avgP1_last=avgP1(1:length(avgP1)-1);

avgP1_2last=avgP1_last(1:length(avgP1_last)-1);

fluctuaction2=norm(avgP1(2:end)-avgP1_last,1)+norm(2*avgP1_last(2:end)+avgP1_2last+avgP1(3:end),2);

smoothness=1/fluctuaction2;

Improvement_factor=smoothness2/smoothness

Table 3

Second Layer (Central Controller Side) - File 4

This code performs the real-time solar smoothing by employing the prediction algorithm

```
clearvars -except PT
clearvars -global
load('Power3.mat')
Q=[];
t = timer;
t.StartFcn;
t.TimerFcn={@BESScomsolar2,PT,Q};
t.StopFcn;
t.Period = 6;
t.TasksToExecute = size(PT,1)-640;
t.ExecutionMode = 'fixedRate';
start(t)
```

Table 4

Second Layer (Central Controller Side) - File 2

This code represents the function used in Table 3

```
%%%%%%% optimized filter%%%%%%%%%%
%%%%%%% prediction %%%%%%%%%%%%%%%
function BESScomsolar2(obj,event,PT,Q)
    load('FIR_filter_optimized.mat')
    load('forcast_function_244_0.37.mat')
    global Q MA signal Ptiming MAtiming Sigtiming DataT
    event_time = datestr(event.Data.time,'dd-mmm-yyyy HH:MM:SS.FFF');
    i=size(Q,1);
    Q=PT(640:i+640);
    Ptiming(i+1,1:4)=[PT(i+640),fix(event.Data.time(4:6))];

%% prediction
if length(Q)>=2
st=1;
    Cp=[];
    Lp=[];

[Cp,Lp] = wavedec(Q,3,'db20');
    ca3p = wrcoef('a',Cp,Lp,'db20',3);
    cd3p = wrcoef('d',Cp,Lp,'db20',3);
    cd2p = wrcoef('d',Cp,Lp,'db20',2);
    cd1p = wrcoef('d',Cp,Lp,'db20',1);

Y1 = forecast(fit1,ca3p,st);
    %Y1T=[Y1T; Y1];
    Y2 = forecast(fit2,cd3p,st);
```

```
%Y2T=[Y2T; Y2];
Y3 = forecast(fit3,cd2p,st);
%Y3T=[Y3T; Y3];
Y4 = forecast(fit4,cd1p,st);
%Y4T=[Y4T; Y4];

% G=Y1T+Y2T+Y3T+Y4T;
% E=P(2:end)-G;
% inputSeries=num2cell(P(1:end-1)'/max(P));
% target=num2cell(E');
% [Xs,Xi,Ai,Ts] = preparets(net,inputSeries,{},target);
% Comp=[num2cell(zeros(1,delayt)) net(Xs,Xi)]';
% Comp=cell2mat(Comp);
%
% F=G+Comp;
    q_t_1=Y1+Y2+Y3+Y4;
    QQ=[Q; q_t_1];

avgP2 = filter(w, 1, QQ);
    MA_act=avgP2(i+2);
    signal(i+1)=q_t_1-MA_act;
else
    avgP1 = filter(w, 1, Q);
    MA(i+1)=avgP1(i+1);
    signal(i+1)=Q(i+1)-MA(i+1);
end
%%
    avgP1 = filter(w, 1, Q);
    MA(i+1)=avgP1(i+1);
    MAtiming(i+1,1:4)=[MA(i+1), fix(event.Data.time(4:6))];
    Sigtiming(i+1,1:4)=[signal(i+1), fix(event.Data.time(4:6))];
```

```
current=abs(signal(i+1)/360);
if (signal(i+1)/360)<0
   status=1;

else
   status=0;
end
url
=['https://192.168.1.120/awp/Battery%20Storage%20System/test5.htm?stat
s=',int2str(status),'&mode=0&current=',int2str(current),'&pf=1'];
[stat,h]=web(url);
%close(h)
DataT(i+1,1:6)=[PT(i+640), MA(i+1),signal(i+1), fix(event.Data.time(4:6))];
size(DataT,1)/(size(PT,1)-640)*100
save('SolarCalc_Predict','Ptiming','MAtiming','Sigtiming','DataT')

end
```

Table 5

(timerDCFC)

This code performs the real-time peak demand cutting of DCFC

```
clearvars -except PTT
clearvars -global
Q=[];
t = timer;
t.StartFcn;
t.TimerFcn={@BESScomDCFC,PTT,Q};
t.StopFcn;
t.Period = 6;
t.TasksToExecute = size(PTT,1);
t.ExecutionMode = 'fixedRate';
start(t)
```

Table 6

Second Layer (Central Controller Side) - File 3

This code represents the function used in Table 5

```
function BESScomDCFC(obj,event,P,Q)
        global Q MA signal Ptiming MAtiming Sigtiming DataT
        event_time = datestr(event.Data.time,'dd-mmm-yyyy HH:MM:SS.FFF');
            i=size(Q,1);
            Q=P(1:i+1);
            Ptiming(i+1,1:4)=[P(i+1),fix(event.Data.time(4:6))];
            ss=size(Q,1);
            res=1;
            NofPrec =round(size(P,1)/res);
            m=min(NofPrec,ss);
         MA(i+1)=mean(Q(ss-m+1:ss,1));
            MAtiming(i+1,1:4)=[MA(i+1), fix(event.Data.time(4:6))];
            signal(i+1)=MA(i+1)-Q(i+1);
         if signal(i+1)>30000
                signal(i+1)=MA(i+1)-Q(i+1);
            signal(i+1)= 30000;

end
            if signal(i+1)<-30000
                signal(i+1)=-30000;

end
            Sigtiming(i+1,1:4)=[signal(i+1), fix(event.Data.time(4:6))];
    current=abs(signal(i+1)/360);
    if (signal(i+1)/360)<0
```

```
      status=1;
   else
      status=0;
   end
   url = ['https://192.168.1.120/awp/Battery%20Storage%20System/test5.htm?status=',int2str(status),'&mode=0&current=',int2str(current),'&pf=1'];
   [stat,h]=web(url);
   %close(h)
   DataT(i+1,1:6)=[P(i+1), MA(i+1),signal(i+1), fix(event.Data.time(4:6))];
   size(DataT,1)/size(P,1)*100
   save('DCFCCalc','Ptiming','MAtiming','Sigtiming','DataT')

end
```

Table 7

(timer2)

This code performs the real-time solar smoothing without employing the prediction algorithm

```
clearvars -except PT
clearvars -global
load('Power3.mat')
Q=[];
t = timer;
t.StartFcn;
t.TimerFcn={@BESScomsolar4,PT,Q};
t.StopFcn;
t.Period = 6;
t.TasksToExecute = size(PT,1)-720;
t.ExecutionMode = 'fixedRate';
start(t)
```

Table 8

This code represents the function used in Table 7

```
function BESScomsolar4(obj,event,PT,Q)
    load('FIR_filter_optimized.mat')
    global Q MA signal Ptiming MAtiming Sigtiming DataT
    event_time = datestr(event.Data.time,'dd-mmm-yyyy HH:MM:SS.FFF');
    i=size(Q,1);
    Q=PT(720:i+720);
    ss=size(Q,1);
    avgP2 = filter(a, 1, Q);
    MA(i+1)=avgP2(i+1);
    signal(i+1)=Q(i+1)-MA(i+1);
    power=abs(signal(i+1));
    if (signal(i+1))<0
        status=1;
    else
        status=0;
    end
    url =
['https://192.168.1.120/awp/Battery%20Storage%20System/test6.htm?status=',int2str(status),'&mode=0&power=',int2str(power),'&pf=1'];
    [stat,h]=web(url);
    %close(h)
    DataT(i+1,1:6)=[PT(i+720), MA(i+1),signal(i+1), fix(event.Data.time(4:6))];
    size(DataT,1)/(size(PT,1)-720)*100
    save('SolarCalc','DataT')

end
```

What is claimed is:

1. A battery energy storage system (BESS), the system comprising:
   (a) a central controller computer;
   (b) a non-transitory memory storing instructions executable by the central computer;
   (c) a local controller computer;
   (d) a non-transitory memory storing instructions executable by the local computer;
   (e) wherein said central controller instructions and said local controller instructions, when respectively executed by the central controller computer and the local controller computer allow for a communications interface configured for network communications therebetween;
   (f) a control system computer comprising the local controller computer and the central controller computer;
   (g) a grid tie inverter, comprising:
      (1) a port for connection to an electrical grid;
      (2) a port for connection to a battery; and
      (3) a communications interface configured for communications with the control system;
   (h) wherein said central controller and said local controller instructions, when executed among the local controller computer and the central controller memory, form a set of operational instructions performing steps comprising:
      (1) controlling communication between the central controller computer and the local controller computer;
      (2) executing a safety features control section; and
      (3) executing an operation control and monitoring section; and
   (i) a second grid tie inverter, the second grid tie inverter comprising:
      (1) a second port for connection to an electrical grid;
      (2) a second port for connection to a photovoltaic system; and
      (3) a second communications interface configured for communications with the control system; and
   wherein the set of operational instructions further performs steps comprising:
      (1) collecting an historical power series;
      (2) decompositing the historical power series into a constitutive series through wavelet transformations;
      (3) modeling each of the constitutive series by a plurality of Auto-Regressive Moving Average (ARMA) models for recognition of their linear patterns, whereby a plurality of ARMA models are produced;
      (4) recompositing an estimated series obtained from the plurality of ARMA models for each constitutive series through an inverse wavelet transform; and
      (5) compensating for an error of the wavelet transformation and ARMA model predictions by recurrent neural networks through capturing of nonlinear patterns buried in a difference between the historical power series and the estimated series, whereby a time series estimate is produced.

2. The battery energy storage system (BESS) of claim 1, wherein the control system computer is configured to monitor and control criteria for the safe operation of the battery.

3. The battery energy storage system (BESS) of claim 2, wherein the monitor and control criteria for the safe operation of the battery are selected from the group of criteria consisting of:
   (a) detecting battery over-temperature;
   (b) detecting battery overcurrent charging;
   (c) detecting battery overcurrent discharging;
   (d) detecting battery undervoltage;
   (e) detecting battery overvoltage;
   (f) detecting battery ventilation control;
   (g) detecting battery ventilation fault;
   (h) detecting battery cell imbalance;
   (i) detecting degraded battery state of health;
   (j) detecting battery short circuit;
   (k) detecting arc fault; and
   (l) detecting ground fault.

4. The battery energy storage system (BESS) of claim 1, wherein the control system computer is configured to monitor and control criteria for the safe operation of the grid.

5. The battery energy storage system (BESS) of claim 4, wherein the monitor and control criteria for the safe operation of the grid are selected from the group of criteria consisting of:
   (a) monitoring and controlling of the BESS in real time;
   (b) providing grid support by leveling loads on the electrical grid;
   (c) regulating electrical grid voltage;
   (d) improving power quality of the electrical grid;
   (e) improving transient and phase stability of the electrical grid;
   (f) compensating for unbalanced loads on the electrical grid; and
   (g) providing spinning reserves for the grid.

6. The battery energy storage system (BESS) of claim 1, wherein said set of operational instructions are configured to manage system operational modes selected from the group consisting of: a battery charging mode, a battery discharging mode, a current leading mode, and a current lagging mode.

* * * * *